(12) United States Patent  
Yamashita

(10) Patent No.: US 11,244,842 B2  
(45) Date of Patent: Feb. 8, 2022

(54) PROCESSING APPARATUS FOR DETECTING DEFECTS INSIDE ELECTRONIC COMPONENT INCLUDING ILLUMINATION PORTION AND IMAGING PORTION

(71) Applicant: UENO SEIKI CO., LTD., Fukuoka (JP)

(72) Inventor: Yotaro Yamashita, Fukuoka (JP)

(73) Assignee: UENO SEIKI CO., LTD., Fukuoka (JP)

( * ) Notice: Subject to any disclaimer, the term of this patent is extended or adjusted under 35 U.S.C. 154(b) by 0 days.

(21) Appl. No.: 17/123,699

(22) Filed: Dec. 16, 2020

(65) Prior Publication Data

US 2021/0202286 A1  Jul. 1, 2021

(30) Foreign Application Priority Data

Dec. 25, 2019 (JP) .............................. JP2019-234656

(51) Int. Cl.
*H01L 21/67* (2006.01)
*G06T 7/00* (2017.01)
(Continued)

(52) U.S. Cl.
CPC ... *H01L 21/67288* (2013.01); *G01N 21/8851* (2013.01); *G06T 7/001* (2013.01);
(Continued)

(58) Field of Classification Search
None
See application file for complete search history.

(56) References Cited

U.S. PATENT DOCUMENTS

2006/0158831 A1* 7/2006 Sakai ................. H05K 13/0812  
361/600  
2008/0037859 A1 2/2008 Ohkura et al.  
(Continued)

FOREIGN PATENT DOCUMENTS

EP 3413339 A1 * 12/2018 ........... G06T 7/0002  
JP 2006 184177 A 7/2006  
(Continued)

OTHER PUBLICATIONS

First Office Action dated Mar. 10, 2020, issued by the Japanese Patent Office in counterpart Japanese Application No. 2019-234656.
(Continued)

*Primary Examiner* — Mohammed Jebari  
(74) *Attorney, Agent, or Firm* — Sughrue Mion, PLLC

(57) ABSTRACT

An processing apparatus includes a first illumination portion and a first imaging portion. The first illumination portion irradiates ta second inner surface on an opposite side of a second outer surface and a third inner surface on an opposite side of a third outer surface via a first outer surface of the electronic component with irradiation light in a state where the electronic component is disposed on a first inspection position. The first imaging portion captures an image of a first internal corner portion formed by the second inner surface and the third inner surface, based on the first irradiation light emitted from the first outer surface after being specularly reflected on the second inner surface and the third inner surface.

4 Claims, 12 Drawing Sheets

(51) Int. Cl.
*H04N 5/225* (2006.01)
*G01N 21/88* (2006.01)
*H04N 5/247* (2006.01)

(52) U.S. Cl.
CPC . *H04N 5/2256* (2013.01); *G06T 2207/30148* (2013.01); *H04N 5/247* (2013.01)

(56) References Cited

U.S. PATENT DOCUMENTS

| | | | | |
|---|---|---|---|---|
| 2008/0174691 | A1* | 7/2008 | Polidor | H04N 5/232 348/348 |
| 2011/0211191 | A1 | 9/2011 | Urano et al. | |
| 2012/0307236 | A1 | 12/2012 | Ortner et al. | |
| 2014/0071243 | A1* | 3/2014 | Nakatsukasa | G01B 11/24 348/46 |
| 2016/0313257 | A1 | 10/2016 | Marivoet et al. | |
| 2016/0321796 | A1* | 11/2016 | Dordoni | H04N 5/2256 |
| 2017/0032177 | A1* | 2/2017 | Suenaga | G06K 9/00208 |
| 2018/0365530 | A1* | 12/2018 | Kluckner | G01N 35/1016 |
| 2018/0374239 | A1* | 12/2018 | Wallack | H04N 13/246 |
| 2019/0178808 | A1* | 6/2019 | Muhr | G01N 21/8806 |
| 2019/0283445 | A1* | 9/2019 | Sones | B41J 3/40733 |
| 2019/0302033 | A1 | 10/2019 | Marivoet et al. | |
| 2020/0158661 | A1* | 5/2020 | Wendel | G06T 7/0002 |
| 2020/0203201 | A1* | 6/2020 | Wendel | G06T 7/0004 |
| 2020/0300619 | A1* | 9/2020 | Cosneau | G06T 7/62 |

FOREIGN PATENT DOCUMENTS

| | | |
|---|---|---|
| JP | 2008 45965 A | 2/2008 |
| JP | 2017 53775 A | 3/2017 |
| JP | 2017 538117 A | 12/2017 |
| JP | 2019 49424 A | 3/2019 |
| WO | 2016 090311 A1 | 6/2016 |

OTHER PUBLICATIONS

Second Office Action drafted on Jun. 19, 2020, issued by the Japanese Patent Office in counterpart Japanese Application No. 2019-234656.

Decision to Grant a Patent drafted Jul. 21, 2020, issued by the Japanese Patent Office in counterpart Japanese Application No. 2019-234656.

* cited by examiner

PROCESSING APPARATUS FOR DETECTING DEFECTS INSIDE ELECTRONIC COMPONENT INCLUDING ILLUMINATION PORTION AND IMAGING PORTION

CROSS REFERENCE TO RELATED APPLICATIONS

This application is based on and claims priority from Japanese Patent Application No. 2019-234656 filed on Dec. 25, 2019 the content of which are incorporated herein by reference.

TECHNICAL FIELD

The present disclosure relates to a processing apparatus for an electronic component.

BACKGROUND ART

An apparatus for detecting defects in a workpiece is disclosed in WO 2016/090311. The apparatus includes at least one light source and a camera with a lens for imaging light from at least one surface of the workpiece onto a detector of the camera, and a stage for moving the workpiece and fully imaging at least the one surface of the workpiece.

SUMMARY OF INVENTION

The present disclosure relates to a processing apparatus for an electronic component capable of accurately detecting defects generated inside the electronic component.

A processing apparatus for an electronic component includes a first illumination portion and a first imaging portion. The electric component includes a first outer surface, a second outer surface on an reverse side of the first outer surface, a third outer surface connected to the first outer surface and the second outer surface, a second inner surface on an opposite side of the second outer surface, a third inner surface on an opposite side of the third outer surface, and a first internal corner portion formed by the second inner surface and the third inner surface. The first illumination portion is configured to irradiate the second inner surface and the third inner surface with a first irradiation light via the first outer surface in a state where the electronic component is disposed on a first inspection position. The first irradiation light is capable of passing through at least a part of the electronic component. The first imaging portion is configured to capture an image of the first internal corner portion based on the first irradiation light emitted from the first outer surface after being specularly reflected on the second inner surface and the third inner surface.

DESCRIPTION OF EMBODIMENTS

Figure 1:
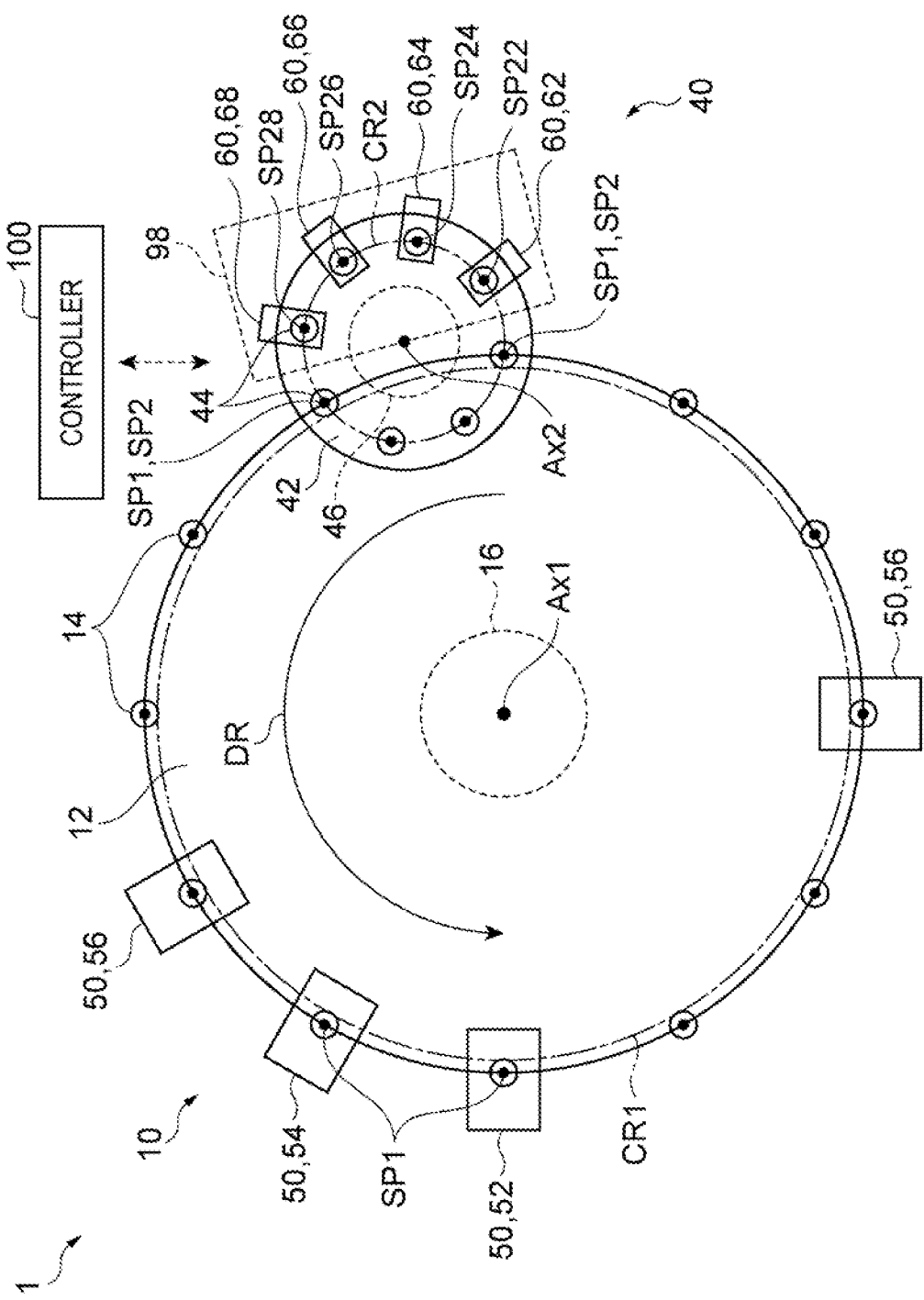
FIG. 1 is a plan view schematically showing an example of a processing apparatus for an electronic component.

Hereinafter, embodiments will be described with reference to the drawings. In the description, the same elements or elements having the same functions are denoted by the same reference numerals, and a repetitive description thereof will be omitted.

[Processing Apparatus for Electronic Component]

A processing apparatus 1 for an electronic component according to the present embodiment is a so-called die sorter, and is an apparatus that performs processing such as appearance inspection, internal defect inspection, electrical property inspection, and marking while conveying an electronic component W formed in previous steps including dicing of a wafer, and packing the electronic component into a tape, a container tube, a tray, and the like.

Figure 2:
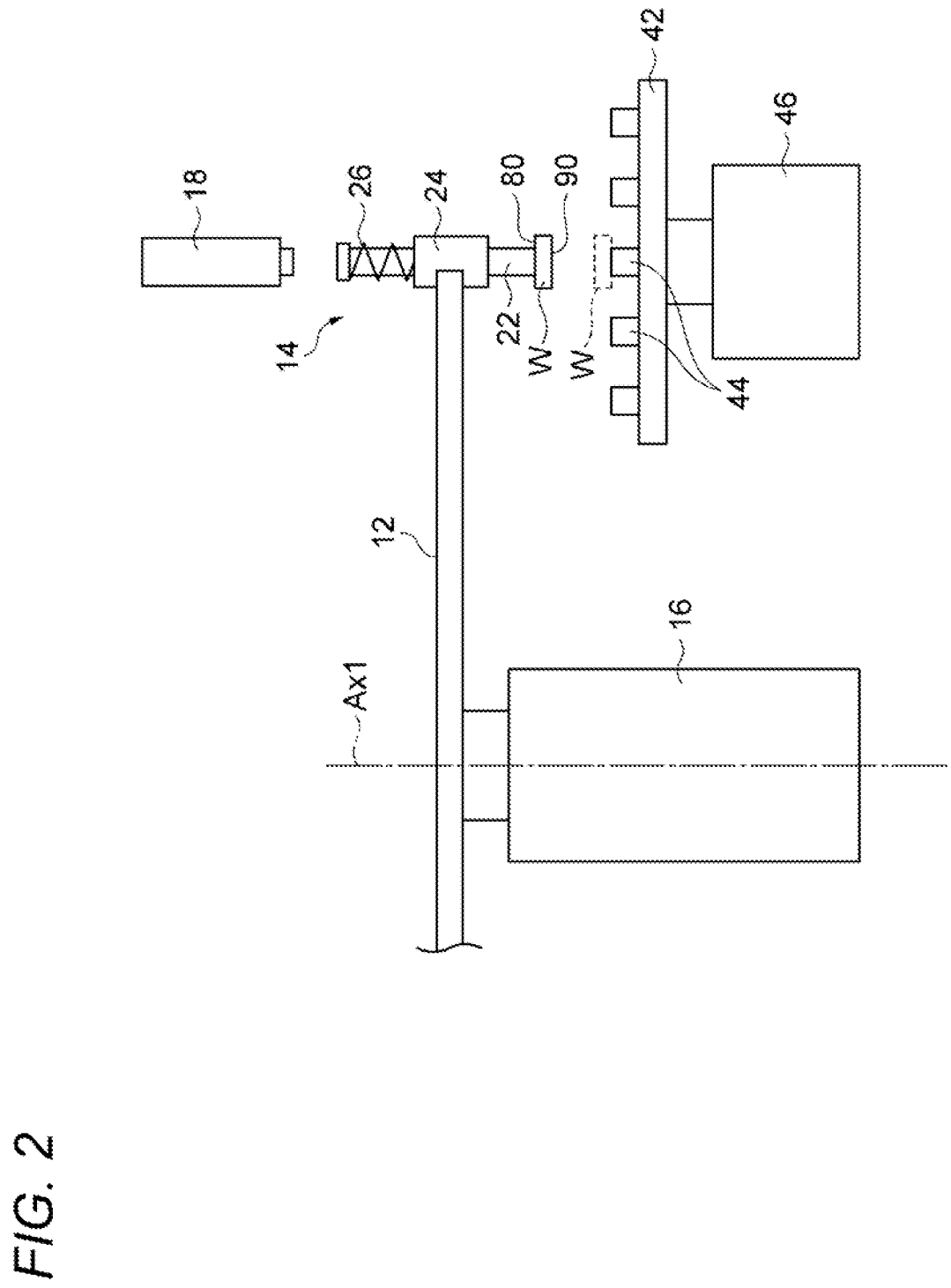
FIG. 2 is a side view schematically illustrating an example of the processing apparatus for an electronic component.

As shown in FIGS. 1 and 2, the processing apparatus 1 includes a rotation conveyance portion 10, a rotation conveyance portion 40, and a controller 100. The rotation conveyance portion 10 moves the electronic component W along a conveyance track CR1. The conveyance track CR1 is, for example, a horizontal circular track about the vertical axis Ax1. The electronic component W to be conveyed has two main surfaces 80, 90 parallel to each other, and an outer peripheral surface. The outer peripheral surface surrounds the main surface 80 and the main surface 90. The main surface 90 positions on a reverse side of the main surface 80. The rotation conveyance portion 10 includes a turntable 12, a plurality of holding portions 14, a rotation driving portion 16, and a plurality of elevation driving portions 18. The turntable 12 is provided so as to be rotatable about the axis Ax.

The plurality of holding portions 14 are disposed at equal intervals along the circumference about the axis Ax1, and are fixed to the turntable 12. Each of the plurality of holding portions 14 is configured to hold the electronic component W. The holding portions 14 may hold the electronic component W by any method. Specific examples of the method of holding the electronic component W by the holding portions 14 include vacuum suction, electrostatic suction, and gripping. For example, the holding portion 14 vacuum-suctions the main surface 80 of the electronic component W from one side in a direction perpendicular to the turntable 12 (direction parallel to the axis Ax1).

As illustrated in FIG. 2, the holding portion 14 includes a suction rod 22, a holder 24, and a spring 26. The suction rod 22 suctions the main surface 80 of the electronic component W from above. For example, the suction rod 22 is disposed along a direction perpendicular to the turntable 12 and opens downward. The holder 24 is fixed to an outer peripheral portion of the turntable 12, and holds the suction rod 22 so as to be able to elevate and lower. The spring 26 resists the lowering of the suction rod 22 due to the elasticity thereof. The spring 26 elastically deforms in response to the lowering of the suction rod 22 when a downward external force is applied to an upper end portion of the suction rod 22, and elastically returns and pushes the suction rod 22 to the height before lowering when the downward external force disappears. The holding portion 14 further includes a valve (not shown) for switching on/off of the vacuum suction by the suction rod 22 in response to the input of a control signal. Specific examples of the valve include an electromagnetic valve.

The rotation driving portion 16 rotates the turntable 12 about the axis Ax1 by a direct drive without a gear, for example, by a power source such as an electric motor. As a result, the plurality of holding portions 14 move along the conveyance track CR1 about the axis Ax1. The rotation driving portion 16 is controlled so as to repeatedly rotate and stop the turntable 12 at an angle pitch between the adjacent holding portions 14 (hereinafter, referred to as "first angle pitch"). Hereinafter, a plurality of positions where the plurality of holding portions 14 are disposed when the rotation driving portion 16 stops the turntable 12 are referred to as a "plurality of stop positions SP1".

The plurality of elevation driving portions 18 individually elevate and lower the suction rods 22 of the plurality of holding portions 14. In FIG. 1, the elevation driving portions 18 are not shown, and one of the plurality of elevation driving portions 18 is shown in FIG. 2. The plurality of elevation driving portions 18 are provided above the plurality of stop positions SP1, respectively. The elevation driving portions 18 may not be provided above some of the plurality of stop positions SP1. The elevation driving portion 18 applies a downward force to the upper end portion of the suction rod 22 by, for example, an electric motor or an air cylinder, in a state where the holding portion 14 is positioned below thereof. As a result, the suction rod 22 is lowered. When the elevation driving portion 18 releases the state in which the downward force is applied to the upper end portion of the suction rod 22, the suction rod 22 is elevated due to the elasticity of the spring 26.

The rotation conveyance portion 40 receives the electronic component W from the rotation conveyance portion 10, moves the electronic component W along a conveyance track CR2, and delivers the electronic component W to the rotation conveyance portion 10. In this case, the electronic component W is delivered twice between the rotation conveyance portion and the rotation conveyance portion 40. The conveyance track CR2 is, for example, a horizontal circular track about a vertical axis Ax2. A part of the conveyance track CR2 and the axis Ax2 are positioned outside the conveyance track CR1. The diameter of the conveyance track CR2 may be smaller than the diameter of the conveyance track CR1. The rotation conveyance portion 40 includes a satellite table 42, a plurality of holding portions 44, and a rotation driving portion 46. The satellite table 42 is provided so as to be rotatable about the axis Ax2.

The plurality of holding portions 44 are disposed at equal intervals along the circumference about the axis Ax2, and are fixed to the satellite table 42. The number of the holding portions 44 included in the rotation conveyance portion 40 may be smaller than the number of holding portions 14 included in the rotation conveyance portion 10. Each of the plurality of holding portions 44 receives and holds the electronic component W from the holding portion 14. The holding portions 44 may hold the electronic component W by any method. Specific examples of the method of holding the electronic component W by the holding portions 44 include vacuum suction, electrostatic suction, and gripping. For example, the holding portion 44 vacuum-suctions the main surface 90 from one side (lower side) in a direction perpendicular to the satellite table 42 (turntable 12).

The rotation driving portion 46 rotates the satellite table 42 about the axis Ax2 by, for example, an electric motor. As a result, the plurality of holding portions 44 move along the conveyance track CR2 about the axis Ax2. The rotation driving portion 46 is controlled so as to repeatedly rotate and stop the satellite table 42 at an angle pitch between adjacent holding portions 44 (hereinafter, referred to as "second angle pitch"). Hereinafter, a plurality of positions where the plurality of holding portions 44 are disposed when the rotation driving portion 46 stops the satellite table 42 are referred to as a "plurality of stop positions SP2".

The rotation conveyance portion 40 is configured such that stop positions SP2 are positioned vertically below any two stop position SP1. For example, the rotation conveyance portion 40 illustrated in FIG. 1 is configured such that two stop positions SP2 separated by five pitches of the second angle pitch outside the conveyance track CR1 are positioned vertically below two adjacent stop positions SP1. Hereinafter, these two stop positions SP1 and SP2 are referred to as "delivery stop positions SP1, SP2". A position where the electronic component W is delivered from the holding portion 14 (suction rod 22) to the holding portion 44 in the two delivery stop positions SP1. SP2 is referred to as a "first delivery position", and a position where the electronic component W is delivered from the holding portion 44 to the holding portion 14 is referred to as a "second delivery position".

More specifically, the satellite table 42 is provided below the turntable 12. When viewed from above in the vertical direction, the conveyance track CR2 intersects the conveyance track CR1 at two adjacent stop positions SP1 (two delivery stop positions SP1, SP2). In the example shown in FIG. 1, the two delivery stop positions SP1, SP2 are separated by one pitch of the first angular pitch about the axis Ax1, and are separated by five pitches of the second angular pitch about the axis Ax2 outside the conveyance track CR1.

The processing apparatus 1 may further include a plurality of processing portions 50. The plurality of processing portions 50 include at least a supply portion 52, a collection portion 54, and an intermediate processing portion 56. The supply portion 52 takes out the electronic component W from a dicing tape or the like or receives the electronic component W from a parts feeder or the like, and then supplies the electronic component W to any one of the stop positions SP1. Hereinafter, the stop position SP1 to which the supply portion 52 supplies the electronic component W is referred to as a "supply stop position SP1". In the supply stop position SP1, the holding portion 14 holds the electronic component W supplied by the supply portion 52.

The collection portion 54 collects the electronic component W from the holding portion 14 at any one stop position SP1, and packages the electronic component W into a tape, a container tube, or the like. Hereinafter, the stop position SP1 for collecting the electronic component W by the collection portion 54 is referred to as a "collection stop position SP1". In this configuration, the turntable 12 conveys the electronic component W along the conveyance path DR from the supply stop position SP1 to the collection stop position SP1. Hereinafter, the supply stop position SP1 side in the conveyance path DR is referred to as an "upstream side", and the stop position SP1 side for collection in the conveyance path DR is referred to as a "downstream side". The above-described two delivery stop positions SP1 are positioned between the supply stop position SP1 and the collection stop position SP1 in the conveyance path DR.

The intermediate processing portion 56 performs predetermined processing on the electronic component W held by the holding portion 14 on any stop position SP1 other than the supply, collection, and delivery stop position SP1. Specific examples of the processing include electrical property inspection, appearance inspection, and marking (for example, laser marking). The processing apparatus 1 may include a plurality of intermediate processing portions 56. The plurality of intermediate processing portions 56 may include an upstream intermediate processing portion 56 and a downstream intermediate processing portion 56. The upstream intermediate processing portion 56 performs processing on the electronic component W on a stop position SP1 on the upstream side of the two delivery stop positions SP1. The downstream intermediate processing portion 56 applies processing to the electronic component W on a stop position SP1 on the downstream side of the two delivery stop positions SP1.

The processing apparatus 1 may further include a plurality of processing portions 60 for performing predetermined processing on the electronic component W held by the holding portions 44. The plurality of processing portions 60 performs processing on the electronic component W held by the holding portion 44 on any stop position SP2 other than the two delivery stop position SP2. Specific examples of the processing include electrical property inspection, appearance inspection, internal defect inspection, and marking (for example, laser marking).

(Inspection Portion)

The plurality of processing portions 60 may include inspection portions 62, 64, 66, and 68 for performing defect inspection inside the electronic component W. The inspection portions 62, 64, 66, and 68 are respectively disposed on four stop positions SP2 positioned between the first delivery position and the second delivery position on a track positioned outside the conveyance track CR1 in the conveyance track CR2. The inspection portions 62, 64, 66, and 68 are disposed in this order from the first delivery position on the track, for example. Hereinafter, the stop positions SP2 where the inspection portions 62, 64, 66, and 68 are respectively disposed are "stop position SP22", "stop position SP24", "stop position SP26", and "stop position SP28".

Figure 3A:
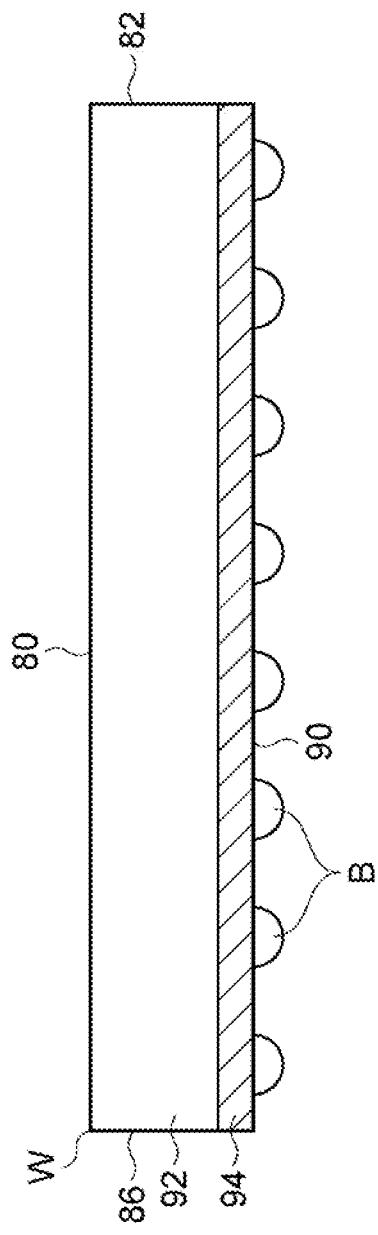
FIG. 3A is a side view schematically illustrating an example of an electronic component to be processed.
Figure 3B:
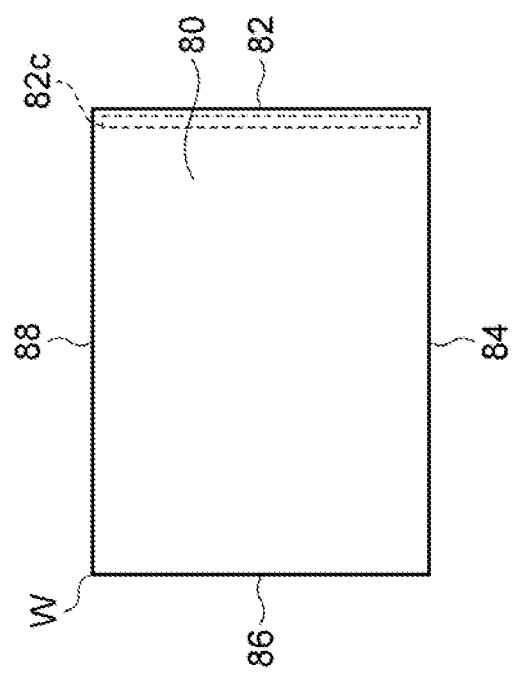
FIG. 3B is a plan view schematically illustrating an example of the electronic component to be processed.

Here, an example of the electronic component W to be inspected by the inspection portions 62, 0.64, 66, and 68 will be described in detail. FIGS. 3A and 3B illustrate details of the electronic component W to be processed. As shown in FIG. 3A, the electronic component W is formed in a rectangular parallelepiped shape. The main surface 90 (second outer surface) of the electronic component W is a main surface of the surfaces of the electronic component W on which bumps B are provided. The main surface 80 (first outer surface) of the electronic component W is a main surface of the surfaces of the electronic component W which positions on a reverse side of the main surface 90 on which the bumps B are provided. On the main surface 80, for example, a mark for identifying the electronic component W is formed.

The outer peripheral surface (outer peripheral surface) of the electronic component W includes four side surfaces 82, 84, 86, and 88. Each of the side surfaces 82, 84, 86, and 88 is connected to the main surface 80 and the main surface 90. The side surfaces 82, 84, 86, and 88 are annularly connected in this order, and the side surface 82 and the side surface 86 are positioned reversely each other, and the side surface 84 and the side surface 88 are positioned reversely each other. The electronic component W includes a base member 92 and a wiring layer 94 that overlap in a direction perpendicular to the main surfaces 80 and 90. One surface of the base member 92 constitutes the main surface 80, and one surface of the wiring layer 94 constitutes the main surface 90. The side surfaces 82, 84, 86, and 88 are configured by side surfaces of the base member 92 and side surfaces of the wiring layer 94, respectively. The base member 92 is, for example, a silicon substrate (wafer). The wiring layer 94 includes, for example, a metal wiring and a resin that covers the wiring.

Figure 4:
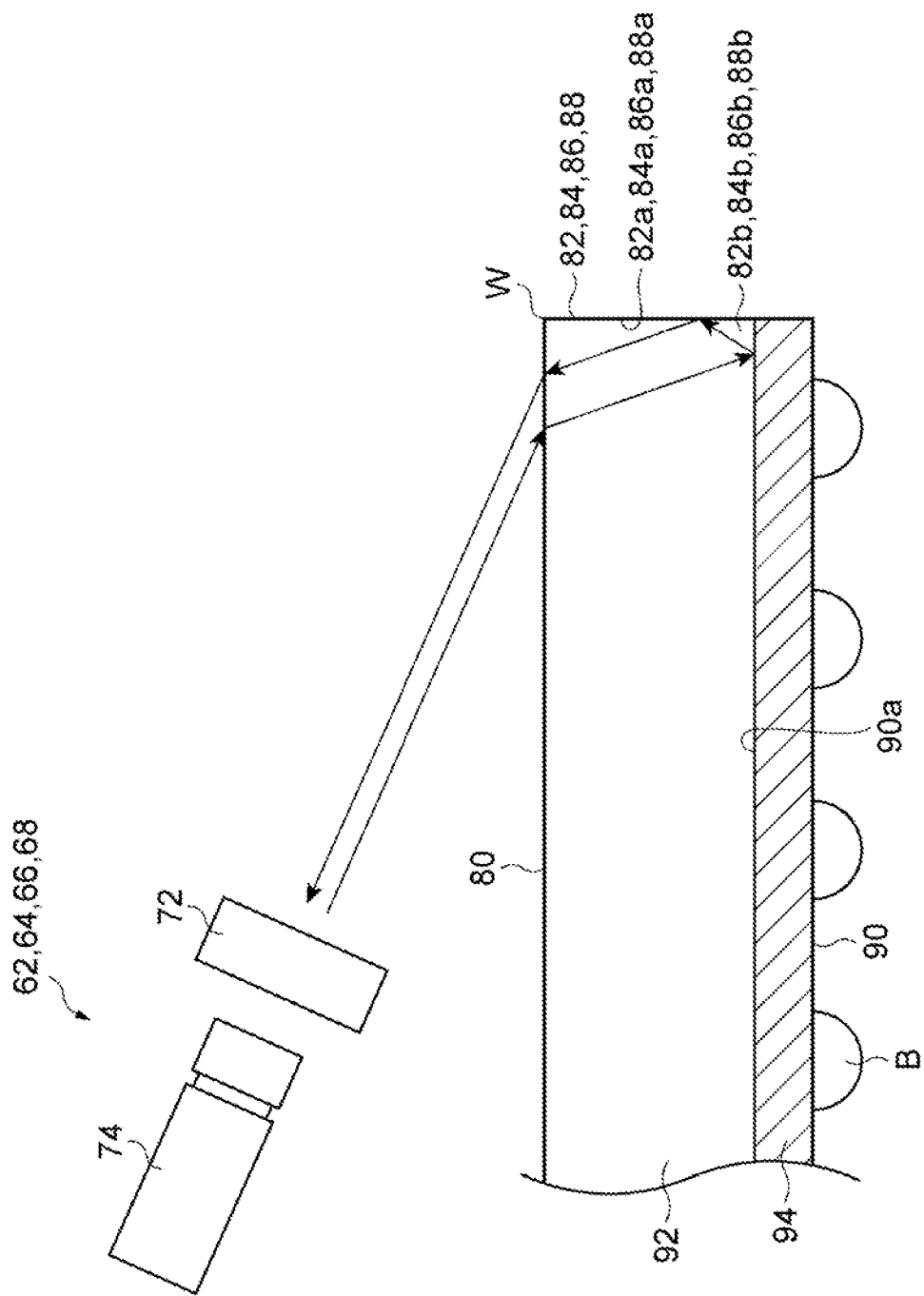
FIG. 4 is a side view schematically illustrating an example of an inspection portion.

The configuration of the inspection portion will be described by way of example with reference to FIG. 4 by taking the inspection portion 62 as an example. The inspection portion 62 inspects the defect inside the electronic component W disposed on the stop position SP22 (first stop position) on which the inspection portion 62 is positioned. The inspection portion 62 inspects a region of the inside of the electronic component W that is in contact with the side surface 82. Hereinafter, a region of the inside of the electronic component W that is in contact with a side surface is simply referred to as "the inside of the side surface". The inspection portion 62 inspects the inside of the side surface 82 (third outer surface). For example, as shown in FIG. 4, the inspection portion 62 includes an illumination portion 72 (first illumination portion) and an imaging portion 74 (first imaging portion). The electronic component W illustrated in FIG. 4 is held by the holding portion 44 with the main surface 80 facing upward and the main surface 90 facing downward.

The illumination portion 72 includes, for example, a light source for emitting irradiation light (first irradiation light) which passes through the base member 92 and does not pass through the wiring layer 94. In this case, a transmittance of the irradiation light to the inside of the electronic component W in a case where the illumination portion 72 irradiates the main surface 80 with the irradiation light is higher than a transmittance of the irradiation light to the inside of the electronic component W in a case where the main surface 90 is irradiated with the irradiation light. The irradiation light emitted by the illumination portion 72 may be infrared rays having a wavelength of 780 nm or more. The irradiation light emitted by the illumination portion 72 may be near-infrared rays having a wavelength of 780 nm to 3 μm, and may be near-infrared rays having a wavelength of 800 nm to 1400 nm.

The illumination portion 72 irradiates an inner surface 90*a* (second inner surface) on the opposite side of the main surface 90 and an inner surface 82*a* (third inner surface) on the opposite side of the side surface 82 via the main surface 84) with the irradiation light. In the present disclosure, the inner surface on the opposite side of the main surface/side surface is a surface facing the opposite side to the main surface/side surface inside the electronic component W. For example, when a front side (surface facing outside) of one boundary surface between the inside and the outside of the electronic component W is defined as the side surface 82, the back side (surface facing inside) of the boundary surface corresponds to the inner surface on the opposite side of the side surface 82. When the front side (surface facing outside) of one boundary surface between the inside and outside of the electronic component W is defined as the main surface 90, the back side (surface facing inside) of the boundary surface corresponds to the inner surface on the opposite side of the main surface 90. A bonding surface of the wiring layer 94 with the base member 92 also corresponds to the inner surface on the opposite side of the main surface 90.

The imaging portion 74 forms an image of the irradiation light emitted by the illumination portion 72 and reflected inside the electronic component W. The imaging portion 74 of the inspection portion 62 captures an image of an internal corner portion 82b (first internal corner portion) formed by the inner surface 90a and the inner surface 82a, based on the irradiation light emitted from the main surface 80 after being emitted by the illumination portion 72 and specularly reflected on the inner surface 90a and the inner surface 82a. The reflection of the inner surface 90a and the inner surface 82a includes reflection again on the inner surface 82a after being reflected by the inner surface 90a, and reflection again on the inner surface 90a after being reflected by the inner surface 82a. The irradiation light from the illumination portion 72 is reflected inside the electronic component W on the inner surface on the opposite side of the main surface/ side surface. The imaging portion 74 includes a camera for forming an image of the irradiation light emitted from the main surface 80 to the outside of the electronic component W ater being specularly reflected on the inner surface 90a and the inner surface 82a. As the camera, an infrared camera, a CMOS camera, or the like may be used. The camera may be an area sensor type camera capable of capturing an image of a two-dimensionally expanded area by an image sensor in which pixels are two-dimensionally arranged.

The internal corner portion 82b is a corner portion inside the electronic component W (base member 92) formed by the inner surface 90a and the inner surface 82a. The internal corner portion 82b is formed by an intersection line between the inner surface 90a and the inner surface 82a, a part of the inner surface 90a near the intersection line, and a part of the inner surface 82a near the intersection line. As shown in FIG. 3, the internal corner portion 82b may include an inspection target region 82c extending along the intersection line (ridge line) between the inner surface 90a and the inner surface 82a. The inspection target region 82c extends between side surfaces 84, 88 connected to both ends of the inner surface 82a (side surface 82). The length of the inspection target region 82c may be substantially equal to the length between the side surfaces 84, 88. As an example, the length of the inspection target region 82c may be 90% or more, 95% or more, or 98% or more of the length between the side surfaces 84, 88.

The imaging portion 74 may have a field of view capable of capturing an image of the entire region of the inspection target region 82c in a state of being positioned on a fixed position. The imaging portion 74 may include one camera that includes the entire region of the inspection target region 82c in the imaging range. The imaging portion 74 may include a plurality of cameras, and a plurality of cameras may be disposed such that a combined range of a plurality of imaging ranges includes the entire region of the inspection target region 82c. The state of being positioned on the fixed position means that the relative position between the electronic component W to be inspected and the imaging position 74 is constant. For example, in a state where the imaging portion 74 (camera) is fixed on a predetermined position and the holding portion 44 holding the electronic component W is stopped, the imaging portion 74 captures an image of the internal corner portion 82b. Thus, even when the electronic component W is not moved relative to the imaging portion 74 in the direction in which the inspection target region 82c extends, the inspection target region 82c included in the internal corner portion 82b is imaged.

In the stop position SP22, the holding portion 44 may hold the electronic component W such that the main surface 80 of the electronic component W faces the illumination portion 72 and the imaging portion 74. The main surface 80 and the illumination portion 72 face each other along an optical path of the irradiation light that extends between the main surface 80 and the illumination portion 72, and the main surface 80 and the imaging portion 74 face each other along an optical path of the irradiation light that extends between the main surface 80 and the imaging portion 74. The irradiation light from the illumination portion 72 is incident on the main surface 80 along an incident optical path inclined with respect to the normal line of the main surface 80 so as to pass through the main surface 80 and toward the side surface 82. The incident optical path intersects the main surface 80 between the center of the electronic component W and the side surface 82. The inclination of the incident light path and the position on which the incident light path intersects the main surface 80 are adjusted such that the irradiation light reaches the internal corner portion 82b in consideration of refraction on the main surface 80.

The exit optical path of the irradiation light specularly reflected on the inner surface 90a and the inner surface 82a and emitted to the outside of the electronic component W from the main surface 80 is opposite to the incident optical path, and is along the incident optical path. The illumination portion 72 and the imaging portion 74 may be disposed on an extension line of the incident optical path. The light source of the illumination portion 72 may be formed or disposed so as not to block the irradiation light imaged (toward) on the imaging portion 74. For example, the light source of the illumination portion 72 may be a ring-shaped light source formed to surround the imaging portion 74.

The inspection portion 64 is configured similarly to the inspection portion 62, and includes an illumination portion 72 (second illumination portion) and an imaging portion 74 (second imaging portion). The inspection portion 64 differs from the inspection portion 62 in that the inspection portion (A inspects the inside of the side surface 84 (fourth outer surface) of the electronic component W disposed on the stop position SP24 (second inspection position) where the inspection portion 64 is positioned. The illumination portion 72 of the inspection portion 64 emits the irradiation light (second irradiation light) which passes through at least a part of the electronic component W toward the inside of the electronic component W in a state where the electronic component W is disposed on the stop position SP24. The illumination portion 72 of the inspection portion 64 emits the irradiation light to the inner surface 90a and the inner surface 84a (fourth inner surface) on the opposite side of the side surface 84 via the main surface 80.

The imaging portion 74 of the inspection portion 64 captures an image of an internal corner portion 84b (second internal corner portion) formed by the inner surface 90a and the inner surface 84a, based on the irradiation light emitted from the main surface 80 after being emitted by the illumination portion 72 and specularly reflected on the inner surface 90a and the inner surface 84a. The internal corner portion 84b is a corner portion inside the electronic component W (base member 92) formed by the inner surface 90a and the inner surface 84a. The internal corner portion 84b is formed by an intersection line of the inner surface 90a and the inner surface 84a, a part of the inner surface 90a near the intersection line, and a part of the inner surface 84a near the intersection line. In the stop position SP24, the holding portion 44 may hold the electronic component W such that the main surface 80 of the electronic component W faces the illumination portion 72 and the imaging portion 74 of the inspection portion 64.

The inspection portion 66 is configured similarly to the inspection portion 62, and includes an illumination portion 72 (second illumination portion) and an imaging portion 74 (second imaging portion). The inspection portion 66 differs from the inspection portion 62 in that the inspection portion 66 inspects the inside of the side surface 86 (fourth outer surface) of the electronic component W disposed on the stop position SP26 (second inspection position) on which the inspection portion 66 is positioned. The illumination portion 72 of the inspection portion 66 emits the irradiation light (second irradiation light) which passes through at least a part of the electronic component W toward the inside of the electronic component W in a state where the electronic component W is disposed on the stop position SP26. The illumination portion 72 of the inspection portion 66 irradiates the inner surface 90*a* and the inner surface 86*a* (fourth inner surface) on the opposite side of the side surface 86 via the main surface 80 with the irradiation light.

The imaging portion 74 of the inspection portion 66 captures an image of an internal corner portion 86*b* (second internal corner portion) formed by the inner surface 90*a* and the inner surface 86*a*, based on the irradiation light emitted from the main surface 80 after being emitted by the illumination portion 72 and specularly reflected on the inner surface 90*a* and the inner surface 86*a*. The internal corner portion 86*b* is a corner portion inside the electronic component W (base member 92) formed by the inner surface 90*a* and the inner surface 86*a*. The internal corner portion 86*b* is formed by an intersection line of the inner surface 90*a* and the inner surface 86*a*, a part of the inner surface 90*a* near the intersection line, and a part of the inner surface 86*a* near the intersection line. In the stop position SP26, the holding portion 44 may hold the electronic component W such that the main surface 80 of the electronic component W faces the illumination portion 72 and the imaging portion 74 of the inspection portion 66.

The inspection portion 68 is configured similarly to the inspection portion 62, and includes an illumination portion 72 (second illumination portion) and an imaging portion 74 (second imaging portion). The inspection portion 68 differs from the inspection portion 62 in that the inspection portion 68 inspects the inside of the side surface 88 (fourth outer surface) of the electronic component W disposed on the stop position SP28 (second inspection position) on which the inspection portion 68 is positioned. The illumination portion 72 of the inspection portion 68 emits the irradiation light (second irradiation light) which passes through at least a part of the electronic component W toward the inside of the electronic component W in a state where the electronic component W is disposed on the stop position SP28. The illumination portion 72 of the inspection portion 68 irradiates the inner surface 90*a* and the inner surface 88*a* (fourth inner surface) on the opposite side of the side surface 88 via the main surface 80 with the irradiation light.

The imaging portion 74 of the inspection portion 68 captures an image of an internal corner portion 88*b* (second internal corner portion) formed by the inner surface 90*a* and the inner surface 88*a*, based on the irradiation light emitted from the main surface 80 after being emitted by the illumination portion 72 and specularly reflected on the inner surface 90*a* and the inner surface 88*a*. The internal corner portion 88*b* is a corner portion inside the electronic component W (base member 92) formed by the inner surface 90*a* and the inner surface 88*a*. The internal corner portion 88*b* is formed by an intersection line of the inner surface 90*a* and the inner surface 88*a*, a part of the inner surface 90*a* near the intersection line, and a part of the inner surface 88*a* near the intersection line. In the stop position SP28, the holding portion 44 may hold the electronic component W such that the main surface 80 of the electronic component W faces the illumination portion 72 and the imaging portion 74 of the inspection portion 68.

The irradiation ranges of the illumination portions 72 of the inspection portions 62, 64, 66, and 68 may be different from each other. For example, the width of the irradiation range may be set according to the width of the side surface in contact with the inside to be inspected. The imaging ranges of the imaging portions 74 of the inspection portions 62, 64, 66, and 68 may be different from each other. For example, the width of the imaging range may be set according to the width of the side surface in contact with the inside to be inspected. The inspection portions 64, 66, and 68 may be disposed in an order different from the above-described example in the conveyance track CR2. The inspection portion (for example, the inspection portion 64) that performs the next inspection of the inspection portion 62 may be disposed apart from the inspection portion 62 by two or more pitches of the second angle pitch.

Returning to FIG. 1, the processing apparatus 1 may further include a light shielding member 98 that covers a part of the rotation conveyance portion 10. The light shielding member 98 is a cover capable of blocking light. The light shielding member 98 covers the four stop positions SP22, SP24, SP26, and SP28 in which the inspection portions 62, 64, 66, 68 are respectively disposed. The light shielding member 98 further covers the optical path of the irradiation light from the illumination portion 72 to the imaging portion 74 on each stop position. When the light shielding member 98 covers the four stop positions SP2 and the optical path, light (disturbance light) to be incident on the stop positions and the optical path is blocked.

The light shielding member 98 may include a light shielding cover that covers one stop position and an optical path between the illumination portion 72 and the imaging portion 74 on the stop position for each of the four stop positions. The light shielding cover may cover not only the upper side of one stop position including the optical path but also to the lateral side of the stop position. In this case, the stop position including the optical path is individually covered by the light shielding member 98, and in addition to the disturbance light, the irradiation light unintentionally incident from the other stop positions is blocked. The light shielding member 98 may cover at least the stop positions SP22, SP24, SP26, SP28 and the optical path in a period in which the inspection of the inside of the electronic component W is performed by the inspection portions 62, 64, 66, and 68.

(Controller)

The controller 100 controls the rotation conveyance portion 10, the rotation conveyance portion 40, and the processing portions 50, 60 in a preset control procedure. In this control, the controller 100 is configured to execute the conveyance of the electronic component W between the stop position SP22 and the stop position SP24 by the rotation conveyance portion 40. The controller 100 is configured to cause the illumination portion 72 of the inspection portion 62 to irradiate the inner surface 90*a* and the inner surface 82*a* with the irradiation light and cause the imaging portion 74 of the inspection portion 62 to capture an image of the internal corner portion 82*b* in a state where the holding portion 44 is stopped on the stop position SP22. The controller 100 is also configured to cause the illumination portion 72 of the inspection portion 64 to irradiate the inner surface 90a and the inner surface 84a with the irradiation light and cause the imaging portion 74 of the inspection portion 64 to capture an image of the internal corner portion 84b in a state where the holding portion 44 is stopped on the stop position SP24.

Figure 5:
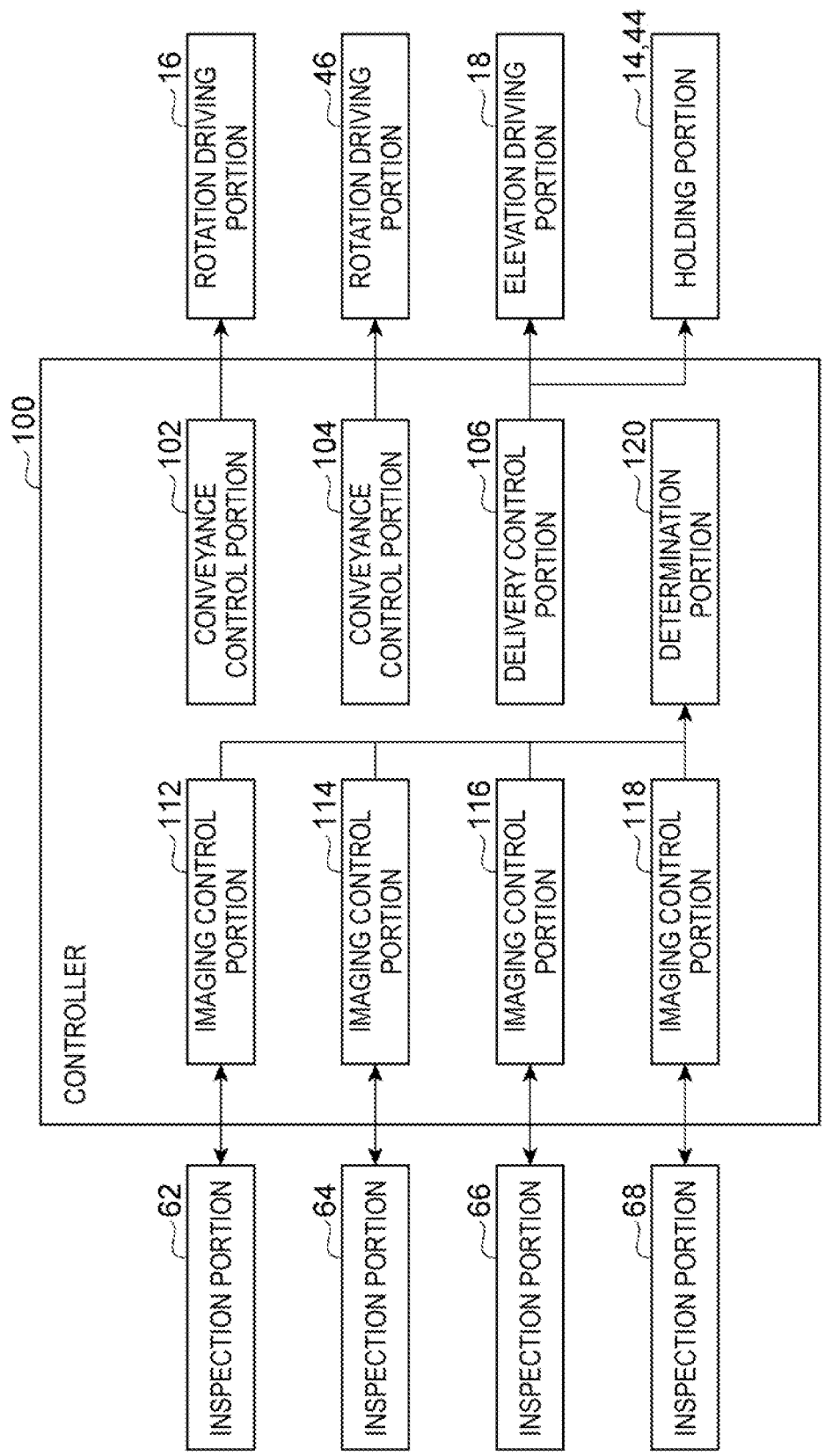
FIG. 5 is a block diagram illustrating an example of a functional configuration of a controller.

As shown in FIG. 5, the controller 100 has a functional configuration (hereinafter referred to as a "functional module"). For example, conveyance control portions 102, 104, a delivery control portion 106, imaging control portions 112, 114, 116, and 118, and a determination portion 120 are provided.

The conveyance control portion 102 controls the rotation driving portion 16 so as to repeatedly rotate and stop the turntable 12 at the first angular pitch about the axis Ax1. As a result, the stop of the holding portion 14 (suction rod 22) on the stop position SP1 described above and the movement of the holding portion 14 from the stop position SP1 to the adjacent stop position SP1 are repeated.

The conveyance control portion 104 controls the rotation driving portion 46 so as to repeatedly rotate and stop the satellite table 42 at the second angular pitch about the axis Ax2. As a result, the stop of the holding portion 44 on the stop position SP2 and the movement of the holding portion 14 from the stop position SP2 to the adjacent stop position SP2 are repeated. The conveyance control portion 104 may control the rotation driving portion 46 to rotate the satellite table 42 during a period in which the rotation driving portion 16 stops the rotation of the turntable 12. The conveyance control portion 104 controls the rotation driving portion 46 so as to repeatedly rotate and stop the satellite table 42, thereby conveying the electronic component W between the stop position SP22 and the stop position SP24 by the rotation conveyance portion 40 (conveyance portion).

The delivery control portion 106 controls the holding portions 14, 44 and the elevation driving portion 18 so as to deliver the electronic component W from the holding portion 14 (suction rod 22) to the holding portion 44 on the first delivery position on the upstream side. For example, the delivery control portion 106 controls the elevation driving portion 18 so as to lower the suction rod 22 disposed on the first delivery position, releases the suction by the suction rod 22, and controls the holding portions 14, 44 such that the suction is performed by the holding portion 44. The delivery control portion 106 controls the holding portions 14, 44 and the elevation driving portion 18 so as to deliver the electronic component W from the holding portion 44 to the holding portion 14 (suction rod 22) on the second delivery position on the downstream side. For example, the delivery control portion 106 controls the elevation driving portion 18 so as to lower the suction rod 22 disposed on the second delivery position, releases the suction by the holding portion 44, and controls the holding portions 14, 44 such that the suction is performed by the suction rod 22.

In a state where the conveyance control portion 104 stops the holding portion 44 on the stop position SP22, the imaging control portion 112 (first imaging control portion) causes the illumination portion 72 of the inspection portion 62 to irradiate the inner surface 90a and the inner surface 82a with the irradiation light, and causes the imaging portion 74 of the inspection portion 62 to capture an image of the internal corner portion 82b. For example, when the conveyance control portion 104 stops the holding portion 44 holding the main surface 9 of the electronic component W on the stop position SP22, the main surface 80 of the electronic component W and the illumination portion 72 and the imaging portion 74 of the inspection portion 62 face each other. The imaging control portion 112 causes the illumination portion 72 to emit the irradiation light to the inner surface 90a and the inner surface 82a of the electronic component W held by the holding portion 44 in a state where the main surface 80 and the illumination portion 72 and the imaging portion 74 face each other and the electronic component W is stopped with respect to the imaging portion 74 in the stop position SP22. While the state where the electronic component W is stopped with respect to the imaging portion 74 is maintained, the imaging control portion 112 causes the imaging portion 74 to capture an image of the internal corner portion 82b (entire region of the inspection target region 82c), based on the irradiation light emitted from the main surface 80 to the outside of the electronic component W after being specularly reflected on the inner surface 90a and the inner surface 82a.

In a state where the conveyance control portion 104 stops the holding portion 44 on the stop position SP24, the imaging control portion 114 (second imaging control portion) causes the illumination portion 72 of the inspection portion 64 to irradiate the inner surface 90a and the inner surface 84a with the irradiation light, and causes the imaging portion 74 of the inspection portion 64 to capture an image of the internal corner portion 84b. For example, when the conveyance control portion 104 stops the holding portion 44 holding the main surface 90 of the electronic component W on the stop position SP24, the main surface 80 of the electronic component W and the illumination portion 72 and the imaging portion 74 of the inspection portion 64 face each other. The imaging control portion 114 causes the illumination portion 72 to emit the irradiation light to the inner surface 90a and the inner surface 84a of the electronic component W held by the holding portion 44 in a state where the main surface 80, the illumination portion 72 and the imaging portion 74 face each other and the electronic component W is stopped with respect to the imaging portion 74 in the stop position SP24. While the state in which the electronic component W is stopped with respect to the imaging portion 74 is maintained, the imaging control portion 114 causes the imaging portion 74 to capture an image of the internal corner portion 84b, based on the irradiation light emitted from the main surface 80 to the outside of the electronic component W after being specularly reflected on the inner surface 90a and the inner surface 84a.

In a state where the conveyance control portion 104 stops the holding portion 44 on the stop position SP26, the imaging control portion 116 (second imaging control portion) causes the illumination portion 72 of the inspection portion 66 to irradiate the inner surface 90a and the inner surface 86a with the irradiation light, and causes the imaging portion 74 of the inspection portion 66 to capture an image of the internal corner portion 86b. For example, when the conveyance control portion 104 stops the holding portion 44 holding the main surface 90 of the electronic component W on the stop position SP26, the main surface 80 of the electronic component W and the illumination portion 72 and the imaging portion 74 of the inspection portion 66 face each other. The imaging control portion 116 causes the illumination portion 72 to emit the irradiation light to the inner surface 90a and the inner surface 86a of the electronic component W held by the holding portion 44 in a state where the main surface 80, the illumination portion 72 and the imaging portion 74 face each other and the electronic component W is stopped with respect to the imaging portion 74 on the stop position SP26. While the state in which the electronic component W is stopped with respect to the imaging portion 74 is maintained, the imaging control portion 116 causes the imaging portion 74 to capture an image of the internal corner portion 86b, based on the irradiation light emitted from the main surface 80 to the outside of the electronic component W after being specularly reflected on the inner surface 90a and the inner surface 86a.

In a state where the conveyance control portion 104 causes the holding portion 44 to stop on the stop position SP28, the imaging control portion 118 (second imaging control portion) causes the illumination portion 72 of the inspection portion 68 to irradiate the inner surface 90a and the inner surface 88a with the irradiation light, and causes the imaging portion 74 of the inspection portion 68 to capture an image of the internal corner portion 88b. For example, when the conveyance control portion 104 causes the holding portion 44 holding the main surface 90 of the electronic component W to stop on the stop position SP28, the main surface 80 of the electronic component W and the illumination portion 72 and the imaging portion 74 of the inspection portion 68 face each other. The imaging control portion 118 causes the illumination portion 72 to emit the irradiation light to the inner surface 90a and the inner surface 88a of the electronic component W held by the holding portion 44 in a state where the main surface 80, the illumination portion 72 and the imaging portion 74 face each other and the electronic component W is stopped with respect to the imaging portion 74 in the stop position SP28. While the state in which the electronic component W is stopped with respect to the imaging portion 74 is maintained, the imaging control portion 118 causes the imaging portion 74 to capture an image of the internal corner portion 88b, based on the irradiation light emitted from the main surface 80 to the outside of the electronic component W after being specularly reflected on the inner surface 90a and the inner surface 88a.

The determination portion 120 determines whether or not there is a defect (damage) inside the electronic component W to be inspected, based on captured images (hereinafter, referred to as "inspection images") acquired by the imaging control portion 112, the imaging control portion 114, the imaging control portion 116, and the imaging control portion 118, respectively. The determination portion 120 determines whether or not there is a crack as a defect inside the electronic component W. When there is no crack in the inspection target region by the inspection portions 62, 64, 66, and 68 in the inside of the electronic component W, the inspection image is generated based on the specularly reflected light from the inner surface 90a and the inner surface of each side surface. On the other hand, when there is a crack in the inspection target region, the irradiation light is scattered (diffusely reflected) by the crack before and after the irradiation light reaches the inner surface 90a and the inner surface of each side surface. Therefore, as compared with the inspection image in a case where there is no crack, there may be a shadow due to the crack in the inspection image in a case where there is a crack. The determination portion 120 may determine whether or not there is a shadow due to a crack in the inspection image.

Figure 7A:
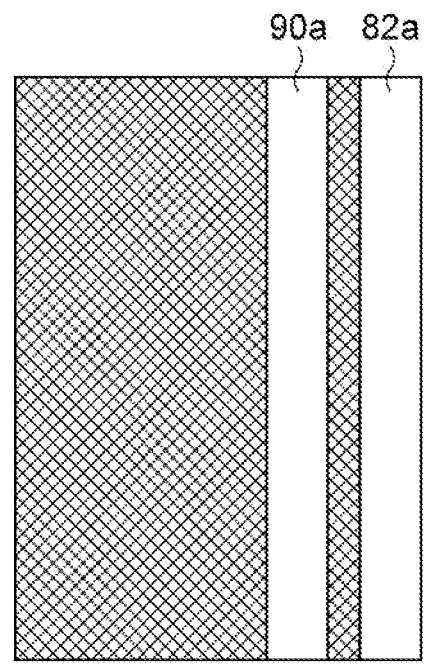
FIGS. 7A and 7B are schematic views illustrating an example of an image captured by the inspection portion.
Figure 7B:
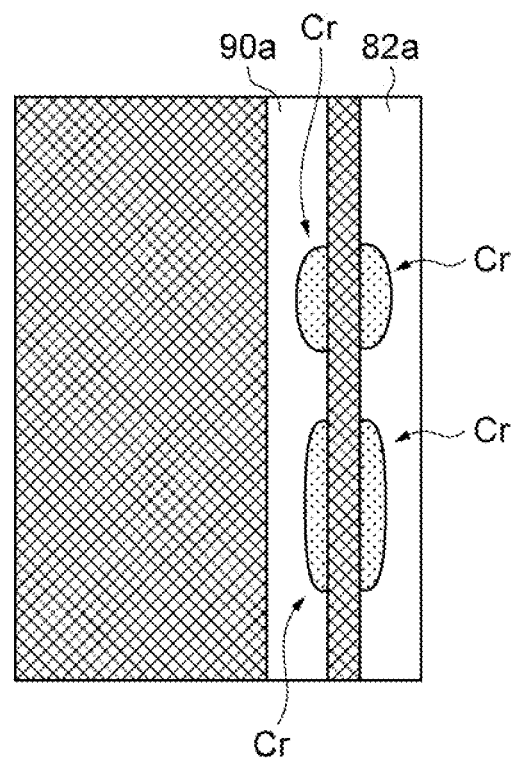

FIG. 7A illustrates an example of an inspection image in a case where there is no crack Cr. FIG. 7B illustrates an inspection image in a case where there is a crack Cr. The determination portion 120 may determine the presence or absence of a crack by comparing the inspection image in the normal state prepared in advance with the inspection image acquired by each imaging control portion. Alternatively, the determination portion 120 may determine the presence or absence of a crack by comparing the luminance values between adjacent pixels along the vertical direction or the horizontal direction on the image, and determining whether there is a place where the difference in luminance value is greater than or equal to a predetermined value.

Figure 6:
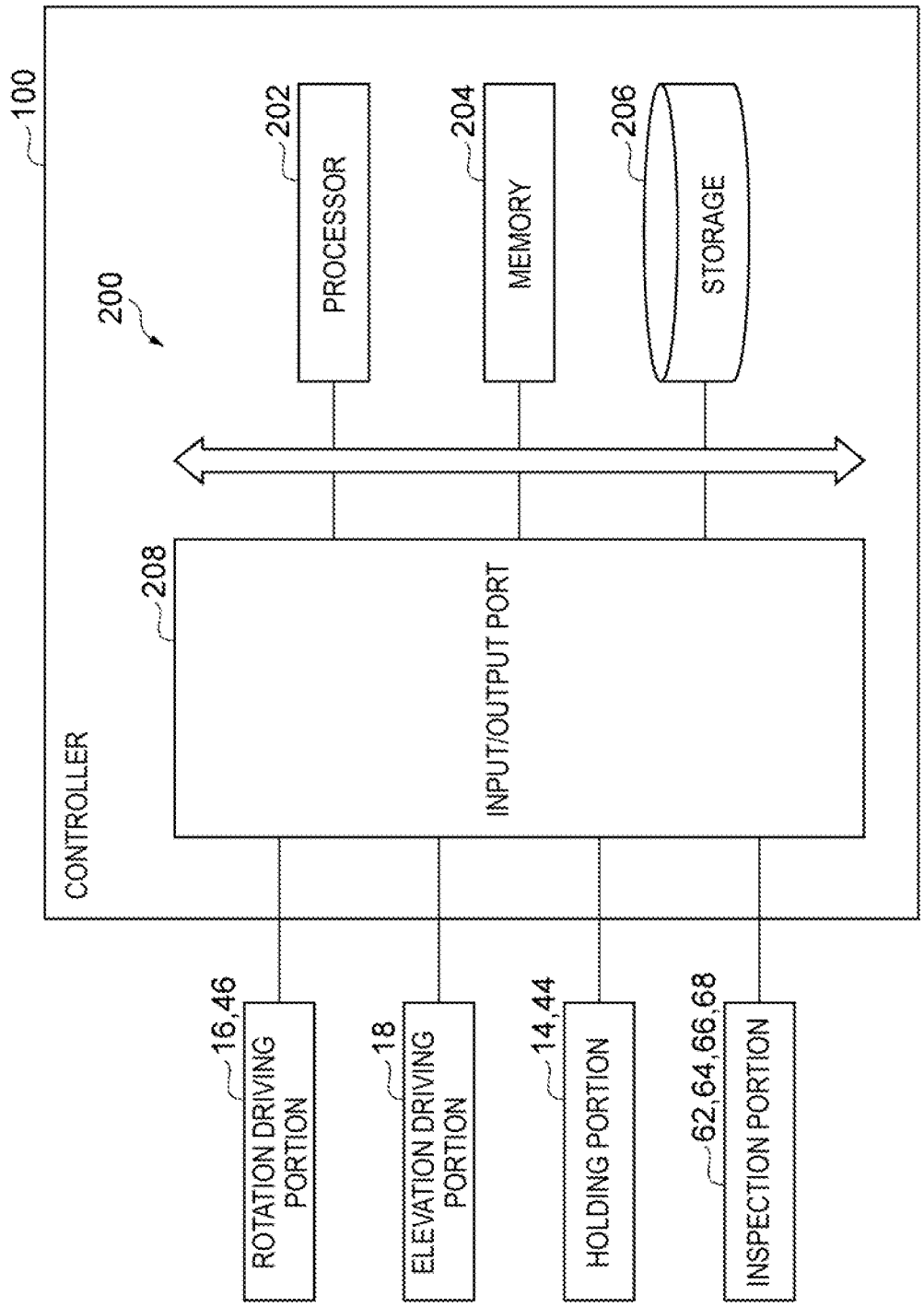
FIG. 6 is a block diagram illustrating an example of a hardware configuration of the controller.

FIG. 6 is a block diagram illustrating a hardware configuration of the controller 100. As shown in FIG. 6, the controller 100 includes a circuit 200. The circuit 200 includes one or more processors 202, a memory 204, a storage 206, and an input/output port 208. The storage 206 includes a computer-readable storage medium such as a nonvolatile semiconductor memory, for example. The storage 206 stores a program for causing the controller 100 to control the rotation conveyance portion 10, the rotation conveyance portion 40, and the processing portions 50, 60 according to a preset control procedure.

This program is configured to cause the controller to execute the rotation conveyance portion 40 to convey the electronic component W between the stop position SP22 and the stop position SP24, the illumination portion 72 of the inspection portion 62 to irradiate the inner surface 90a and the inner surface 82a with the irradiation light, and the imaging portion 74 of the inspection portion 62 to capture an image of the internal corner portion 82b, in a state in which the holding portion 44 is stopped on the stop position SP22. This program is also configured to cause the controller to execute the illumination portion 72 of the inspection portion 64 to irradiate the inner surface 90a and the inner surface 84a with the irradiation light, and the imaging portion 74 of the inspection portion 64 capture an image of the inner surface 90a and the inner surface 84a in a state where the holding portion 44 is stopped on the stop position SP24. For example, the storage 206 stores a program for configuring each functional module described above.

The memory 204 temporarily stores a program loaded from a storage medium of the storage 206 and a calculation result by the processor 202. The processor 202 configures each functional module of the controller 100 by executing the program in cooperation with the memory 204. The input/output port 208 inputs/outputs an electric signal to/from the rotation driving portions 16, 46, the elevation driving portion 18, the holding portions 14, 44, and the inspection portions 62, 64, 66, 68 according to a command from the processor 202. The circuit 200 is not necessarily limited to the one in which each function is formed by a program. For example, the circuit 200 may configure at least a part of the functions thereof by a dedicated logic circuit or an application specific integrated circuit (ASIC) in which the logic circuit is integrated.

[Inspection Procedure of Electronic Component]

Figure 8:
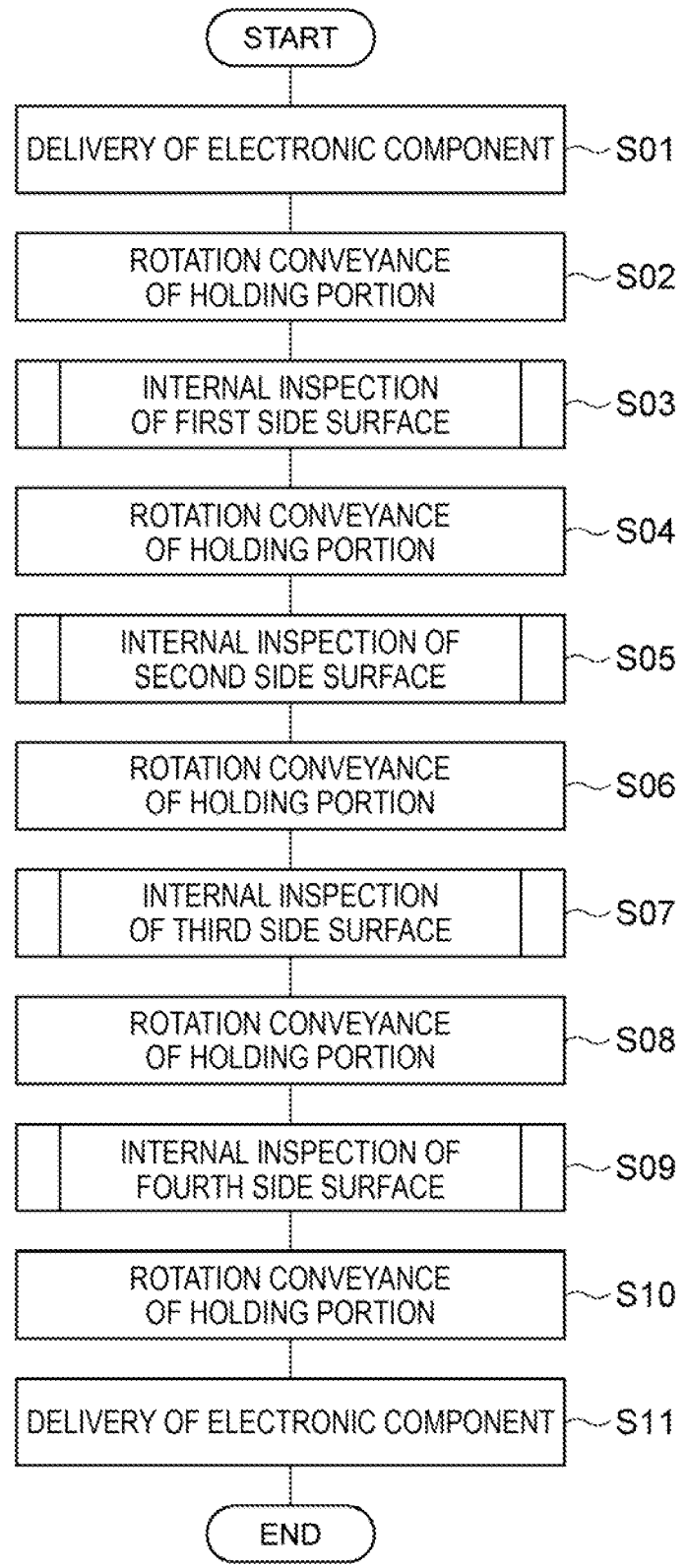
FIG. 8 is a flowchart illustrating an example of an inspection procedure of the electronic component.

Next, an inspection procedure of the electronic component W will be described as an example of a processing method of an electronic component (a control procedure executed by the controller 100). FIG. 8 is a flowchart illustrating an example of an inspection procedure for one electronic component W.

The controller 100 first executes step S01 in a state where the suction rod 22 holding the electronic component W to be inspected is disposed on the first delivery position on the upstream side. In step S01, for example, the delivery control portion 106 controls the elevation driving portion 18 so as to lower the suction rod 22 disposed on the first delivery position, releases the suction of the main surface 80 by the suction rod 22, and controls the holding portions 14, 44 so as to suction the main surface 90 by the holding portion 44. Thus, in the electronic component W to be inspected, the main surface 80 having a high internal transmittance to the irradiation light is opened, and the main surface 90 having a low internal transmittance to the irradiation light is held by the holding portion 44.

Next, the controller 100 executes step S02. In step S02, for example, the conveyance control portion 104 controls the rotation driving portion 46 to rotate the satellite table 42 by one pitch of the second angle pitch about the axis Ax2 and to stop the satellite table 42 after the rotation. Thus, the electronic component W to be inspected and the holding portion 44 holding the electronic component W move to the stop position SP22.

Next, the controller 100 executes step S03. In step S03, for example, the controller 100 causes the inspection portion 62 to perform the inspection inside the side surface 82. A specific example of the internal inspection processing in step S03 will be described later.

Next, the controller 100 executes step S04. In step S04, for example, the conveyance control portion 104 controls the rotation driving portion 46 to rotate the satellite table 42 by one pitch of the second angle pitch about the axis Ax2 and stop the satellite table 42 after the rotation. Thus, the electronic component W to be inspected and the holding portion 44 holding the electronic component W move to the stop position SP24 from the stop position SP22.

Next, the controller 100 executes step S05. In step S05, for example, the controller 100 causes the inspection portion 64 to perform the inspection inside the side surface 84. A specific example of the internal inspection processing in step S05 will be described later.

Next, the controller 100 executes step S06. In step S06, for example, the conveyance control portion 104 controls the rotation driving portion 46 to rotate the satellite table 42 by one pitch of the second angle pitch about the axis Ax2 and stop the satellite table 42 after the rotation. Thus, the electronic component W to be inspected and the holding portion 44 holding the electronic component W move to the stop position SP26 from the stop position SP24.

Next, the controller 100 executes step S07. In step S07, for example, the controller 100 causes the inspection portion 66 to perform the inspection inside the side surface 86. A specific example of the internal inspection processing in step S07 will be described later.

Next, the controller 100 executes step S08. In step S08, for example, the conveyance control portion 104 controls the rotation driving portion 46 to rotate the satellite table 42 by one pitch of the second angle pitch about the axis Ax2 and stop the satellite table 42 after the rotation. Thus, the electronic component W to be inspected and the holding portion 44 holding the electronic component W move to the stop position SP28 from the stop position SP26.

Next, the controller 100 executes step S09. In step S09, for example, the controller 100 causes the inspection portion 68 to perform the inspection inside the side surface 88. A specific example of the internal inspection processing in step S09 will be described later.

Next, the controller 1M executes step S10. In step S10, for example, the conveyance control portion 104 controls the rotation driving portion 46 to rotate the satellite table 42 by one pitch of the second angle pitch about the axis Ax2 and stop the satellite table 42 after the rotation. As a result, the electronic component W to be inspected and the holding portion 44 holding the electronic component W move to the second delivery position on the downstream side from the stop position SP28.

Next, the controller 100 executes step S11. In step S11, for example, the delivery control portion 106 controls the elevation driving portion 18 so as to lower the suction rod 22 disposed on the second delivery position, releases the suction of the main surface 90 by the holding portion 44, and controls the holding portions 14, 44 so as to suction the main surface 80 by the suction rod 22. When the determination result of the defect inspection inside the electronic component W indicates abnormality, the electronic component W may be removed from the processing line without being delivered to the rotation conveyance portion 10.

Thus, a series of inspection procedures of one electronic component W is completed. The controller 100 may also execute steps S01 to S11 for the other electronic components W as well. The controller 100 may execute a series of processes of steps S01 to S11 in parallel with respect to the plurality of electronic components W such that a part of the execution period overlaps with each other. For example, the controller 100 may start executing a series of processes from step S01 for the next electronic component W at a timing that overlaps at least a part of the execution period of step S03 for one electronic component W.

(Internal Inspection Processing)

Figure 9:
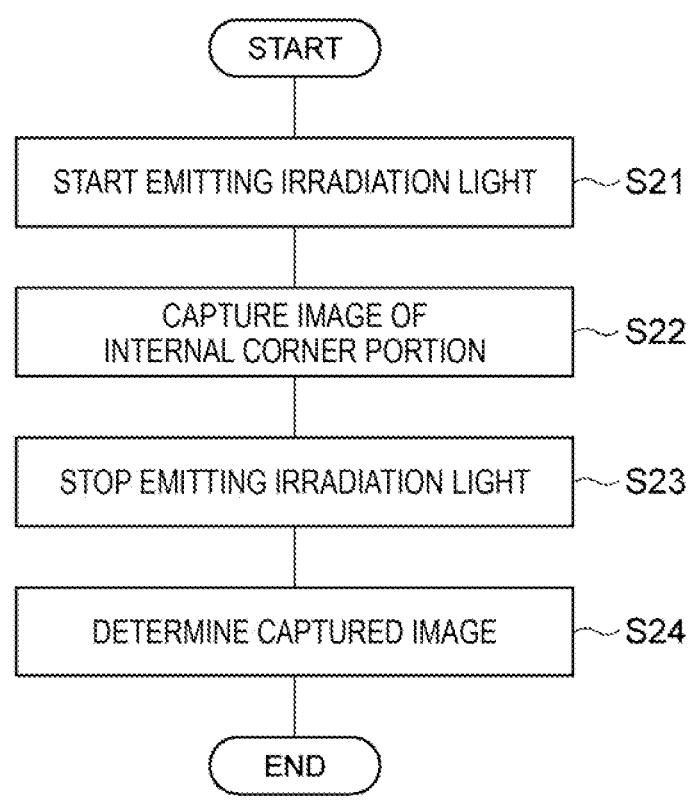
FIG. 9 is a flowchart illustrating an example of an internal inspection processing of one side surface.

FIG. 9 is a flowchart illustrating an example of the internal inspection processing in step S03. In the internal inspection processing, the controller 100 first executes step S21.

In step S21, for example, in a state where the conveyance control portion 104 stops the holding portion 44 on the stop position SP22, the imaging control portion 112 starts irradiating the inner surface 90*a* and the inner surface 82*a* with the irradiation light by the illumination portion 72 of the inspection portion 62.

Next, the controller 100 executes steps S22, S23. In step S22, for example, while the conveyance control portion 104 remains in a state in which the holding portion 44 is stopped on the stop position SP22, the imaging control portion 112 causes the imaging portion 74 to capture an image of the internal corner portion 82*b* (entire region of the inspection target region 82*c*), based on the irradiation light emitted from the main surface 80 to the outside of the electronic component W after being specularly reflected on the inner surface 90*a* and the inner surface 82*a*. Thus, the imaging control portion 112 acquires an inspection image obtained by imaging the internal corner portion 82*b* (entire region of the inspection target region 82*c*). In step S23, for example, the imaging control portion 112 stops emitting the irradiation light by the illumination portion 72.

Next, the controller 100 executes step S24. In step S24, for example, the determination portion 120 determines whether or not there is a crack inside the electronic component W to be inspected based on the inspection image obtained in step S22. The determination portion 120 may determine the presence or absence of a crack by comparing the inspection image in the normal state prepared in advance with the inspection image. The determination portion 120 may output the determination result to an outside (for example, a notification device to an operator) from of the controller 100. Thus, the internal inspection processing of the inside of the side surface 82 is completed.

The internal inspection processing of the inside of the side surfaces 84, 86, and 88 in steps S05, S07, and S09 may be performed in the same manner as steps S21 to S24, respectively. In this case, in the internal inspection processing in step SOS, in a state where the holding portion 44 is stopped on the stop position SP24, the imaging control portion 114 causes the illumination portion 72 of the inspection portion 64 to irradiate the inner surface 90*a* and the inner surface 84*a* with irradiation light, and then causes the imaging portion 74 of the inspection portion 64 to capture an image of the internal corner portion 84*b* based on the irradiation light emitted from the main surface 80 after being specularly reflected on the inner surface 90*a* and the inner surface 84*a*.

In the internal inspection processing in step S07, in the state where the holding portion 44 is stopped on the stop position SP26, the imaging control portion 116 causes the illumination portion 72 of the inspection portion 66 to irradiate the inner surface 90*a* and the inner surface 86*a* with the irradiation light, and then causes the imaging portion 74 of the inspection portion 66 to capture an image of the internal corner portion 86*b* based on the irradiation light emitted from the main surface 80 after being specularly reflected on the inner surface 90*a* and the inner surface 86*a*. In the internal inspection processing in step S09, in the state where the holding portion 44 is stopped on the stop position SP28, the imaging control portion 118 causes the illumination portion 72 of the inspection portion 68 to irradiate the inner surface 90*a* and the inner surface 88*a* with the irradiation light, and then causes the imaging portion 74 of the inspection portion 68 to capture an image of the internal corner portion 88*b* based on the irradiation light emitted from the main surface 80 after being specularly reflected on the inner surface 90*a* and the inner surface 88*a*.

The above-described inspection procedure of the electronic component W is an example, and can be changed as appropriate. The controller 100 may execute one step and the next step in parallel, or may execute the respective steps in an order different from the above-described example. For example, step S24 of step S03 may be performed in parallel with step S04. The determination portion 120 may not determine the inspection image for each inspection surface, but may determine the presence or absence of a crack in the inside of the electronic component W after obtaining a plurality of inspection images in which the insides of the side surfaces 82, 84, 86, and 88 are inspected, respectively. According to the execution of steps S02, S04, S06, S08, and S10, the controller 100 (conveyance control portion 102) may rotate the turntable 12 by one pitch of the first angular pitch by the rotation conveyance portion 10.

The processing apparatus 1 for the electronic component W exemplified above includes an illumination portion 72 and an imaging portion 74. The electronic component W includes a main surface 80, a main surface 90 which is on a reverse side of the main surface 80, a side surface 82 connected to the main surface 80 and the main surface 90, an inner surface 90*a* on the opposite side of the main surface 90, an inner surface 82*a* on the opposite side of the main surface 82, and an internal corner portion 82*b* formed by the inner surface 90*a* and the inner surface 82*a*. The illumination portion 72 is configured to irradiate the inner surface 90*a* and the inner surface 82*a* via the main surface 80 with the irradiation light which is capable of passing through at least a part of the electronic component W, in a state where the electronic component W is stopped on the stop position SP22. The imaging portion 74 is configured to capture an image of the internal corner portion 82*b* based on the irradiation light emitted from the main surface 80 after being specularly reflected on the inner surface 90*a* and the inner surface 82*a*. In this configuration, when there is no crack in the internal corner portion 82*b*, the irradiation light specularly reflected on the inner surface 82*a* and the inner surface 90*a* is observed by the imaging portion 74. On the other hand, when there is a crack in the internal corner portion 82*b*, the irradiation light is diffusely reflected by the crack, and the irradiation light imaged by the imaging portion 74 is reduced. Therefore, the difference (contrast ratio) of the light received amount increases between the case where there is a crack and the case where there is no crack. Therefore, it is possible to detect a defect in the electronic component W with high accuracy.

The internal corner portion 82*b* may include the inspection target region 82*c* extending along the intersection line between the inner surface 90*a* and the inner surface 82*a*. The imaging portion 74 may have a field of view capable of capturing an image of the entire region of the inspection target region 82*c* in a state of being positioned on a fixed position. As described above, since the contrast ratio due to the presence or absence of cracks is large, cracks can be easily detected even by a general-purpose area sensor type imaging portion 74 disposed on a fixed position. By imaging the entire region of the inspection target region 82*c* by the general-purpose area sensor type imaging portion 74 and inspecting the internal corner portion 82*b*, it is possible to improve the processing efficiency of the electronic component W and the simplification of the processing apparatus 1.

The processing apparatus 1 may further include the holding portion 44 which is configured to hold the electronic component W therein. The transmittance of the irradiation light to the inside of the electronic component W when the main surface 80 is irradiated with the irradiation light may be higher than the transmittance of the irradiation light to the inside of the electronic component W when the main surface 90 is irradiated with the irradiation light. The holding portion 44 may hold the electronic component W such that the main surface 80 faces the illumination portion 72 and the imaging portion 74 on the stop position SP22. In this case, compared to a case where the irradiation light is incident on the inside of the electronic component W from the main surface 90, the contrast ratio due to the presence or absence of cracks increases, so that the defect inside the electronic component W can be detected more accurately.

The processing apparatus 1 may further include a rotation conveyance portion 40, an illumination portion 72, and an imaging portion 74. The rotation conveyance portion 40 is configured to convey the electronic component W by moving the holding portion 44 between the stop position SP22 and the stop position SP24 which is different from the stop position SP22. The illumination portion 72 is configured to irradiate the inner surface 90*a* and an inner surface 84*a* with the irradiation light, in a state where the electronic component W is disposed on the stop position SP22. The electronic component W further includes a side surface 84 connected to the main surface 80 and the main surface 90. The inner surface 84*a* positioned on the opposite side of the side surface 84. The irradiation light is capable of passing through at least a part of the electronic component W. The imaging portion 74 is configured to capture an image of the internal corner portion 84*b* formed by the inner surface 90*a* and the inner surface 84*a*, based on the irradiation light emitted from the main surface 80 after being specularly reflected on the inner surface 90*a* and the inner surface 84*a*. In this case, the internal corner portion 84*b* of another electronic component W on the stop position SP24 can be inspected while the internal corner portion 82*b* of one electronic component W on the stop position SP22 is inspected. Therefore, it is useful for the efficiency of processing including inspection of internal defects.

The processing apparatus 1 may further include a light shielding member 98 which covers a stop position SP22, a stop position SP24, an optical path of the irradiation light from the illumination portion 72 of the inspection portion 62 to the imaging portion 74 of the inspection portion 62, and an optical path of the irradiation light from the illumination portion 72 of the inspection portion 64 to the imaging portion 74 of the inspection portion 64. In this case, since disturbance light incident on the imaging portion 74 can be suppressed, it is useful to improve the detection accuracy of the internal defects of the electronic component W.

The processing apparatus 1, may further include a conveyance control portion 104, an imaging control portion 112, and an imaging control portion 114. The conveyance control portion 104 causes the rotation conveyance portion 40 to convey the electronic component W between the stop position SP22 and the stop position SP24. The imaging control portion 112 causes the illumination portion 72 of the inspection portion 62 to irradiate the inner surface 90a and the inner surface 84a with the irradiation light, and causes the imaging portion 74 of the inspection portion 62 to capture an image of the internal corner portion 82b, in a state where the conveyance control portion 104 causes the holding portion to stop on the stop position SP22. The imaging control portion 114 causes the illumination portion 72 of the inspection portion 64 to irradiate the inner surface 90a and the inner surface 84a with the irradiation light, and causes the imaging portion 74 of the inspection portion 64 to capture an image of the internal corner portion 84b, in a state where the rotation conveyance portion 40 causes the holding portion 44 to stop on the stop position SP24. In this case, defects on the two internal corner portions inside the electronic component W can be inspected while the electronic component W can be conveyed along the conveyance track. Therefore, the efficiency of the processing of the electronic component W is improved.

[First Modification]

Figure 10:
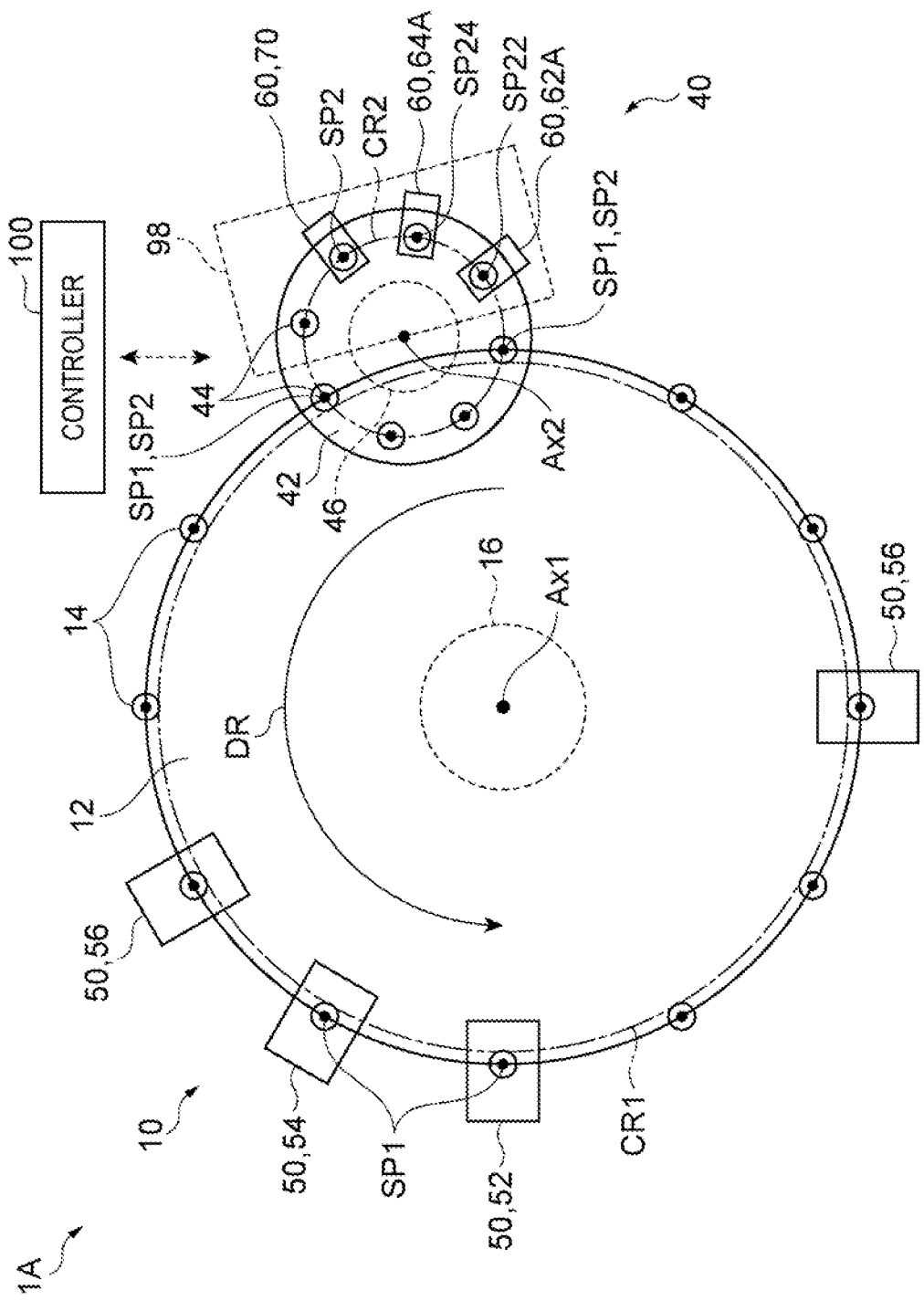
FIG. 10 is a plan view schematically illustrating an example of a processing apparatus for an electronic component.
Figure 11:
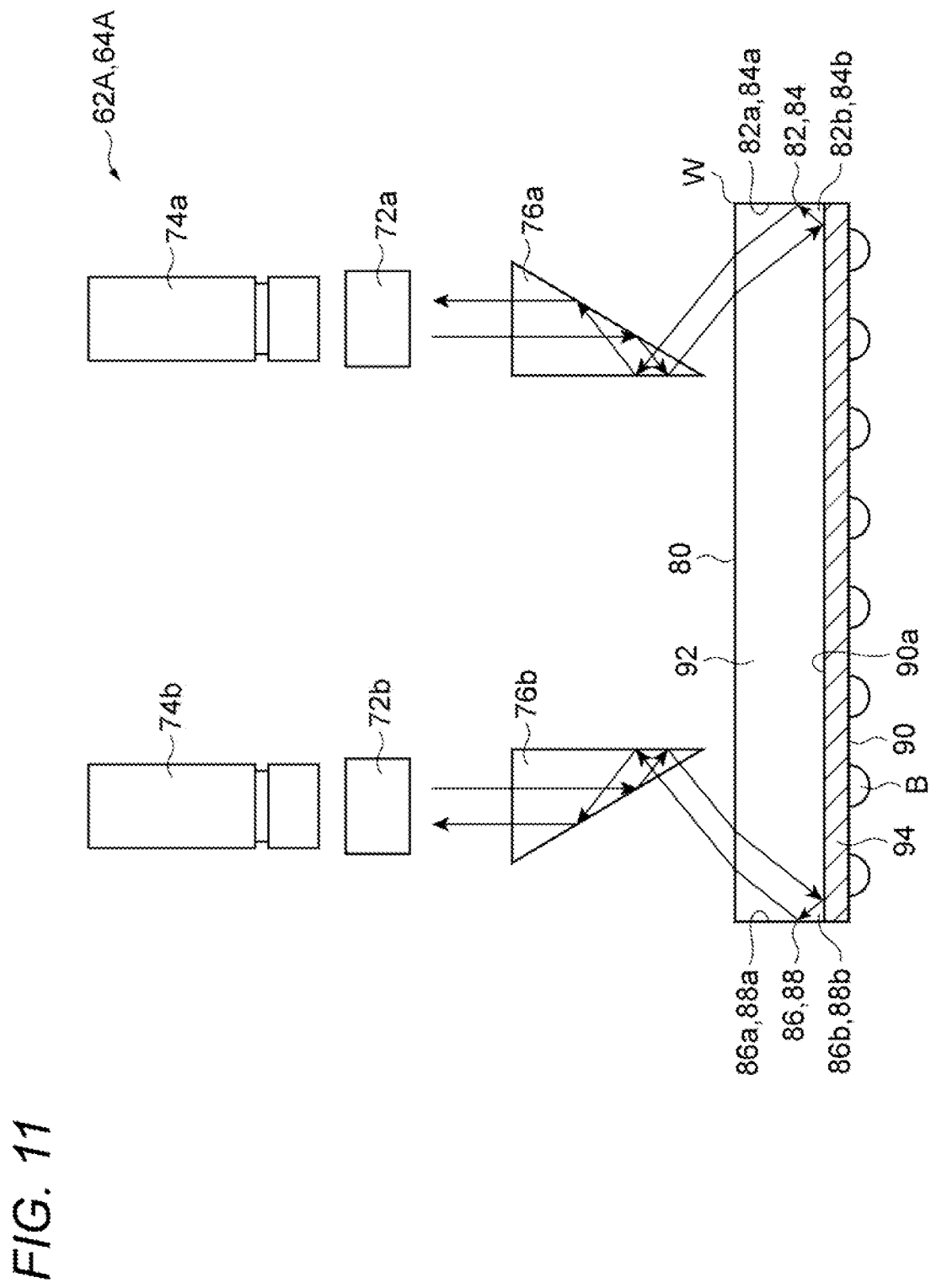
FIG. 11 is a side view schematically illustrating an example of an inspection portion.

The inside inspection of the two side surfaces may be performed at a single stop position SP2. FIGS. 10 and 11 illustrate a processing apparatus 1A according to a first modification. The processing apparatus 1A differs from the processing apparatus 1 in that the processing portion 60 does not include the inspection portions 66, 68 and includes inspection portions 62A, 64A instead of the inspection portions 62, 64. The processing portion 60 of the processing apparatus 1A may include a processing portion 70 that executes processing other than the inspection of the inside of the electronic component W.

The inspection portion 62A differs from the inspection portion 62 in that the inspection portion 62A inspects the inside of the side surface 82 and the inside of the side surface 86, and the inspection portion 64A differs from the inspection portion 64 in that the inspection portion (4A inspects the inside of the side surface 84 and the inside of the side surface 88. The inspection portions 62A, 64A include illumination portions 72a, 72b, imaging portions 74a, 74b, and prisms 76a, 76b, respectively.

The illumination portion 72a (first illumination portion) of the inspection portion 62A emits the irradiation light in a direction perpendicular to the main surface 80. The irradiation light emitted from the illumination portion 72a is turned in a direction inclined with respect to the main surface 80 by the prism 76a having a refractive surface and a reflection surface, and the irradiation light emitted from the prism 76a reaches the inner surface 90a and the inner surface 82a via the main surface 80. The irradiation light reflected by the inner surface 90a and the inner surface 82a is emitted upward from the main surface 90, and is imaged on the imaging portion 74a (first imaging portion) of the inspection portion 62A after the direction is changed vertically upward by the prism 76a. The prism 76a is configured and disposed such that the irradiation light emitted from the prism 76a goes through the main surface 80 toward the side surface 82. The prism 76a may be any prism as long as the prism has a reflective surface that reflects the irradiation light toward the inner surface 90a and the inner surface 82a. Instead of the prism 76a, a plate-shaped mirror may be used.

Similarly to the illumination portion 72a, the illumination portion 72b (first illumination portion) of the inspection portion 62A irradiates the inner surface 90a and the inner surface 86a with the irradiation light via a prism 76b having a refractive surface and a reflection surface. Similarly to the illumination portion 72b, the imaging portion 74b (first imaging portion) of the inspection portion 62A forms an image of the irradiation light reflected by the inner surface 90a and the inner surface 86a via the prism 76b. The prism 76b is configured and disposed such that the irradiation light emitted from the prism 76b goes through the main surface 80 toward the side surface 86. The prism 76b may be any prism as long as the prism has a reflective surface that reflects the irradiation light toward the inner surface 90a and the inner surface 86a. Instead of the prism 76b, a plate-shaped mirror may be used.

The main surface 80 of the electronic component W disposed on the stop position SP22 faces the illumination portion 72a and the imaging portion 74a via the prism 76a, and faces the illumination portion 72b and the imaging portion 74b via the prism 76b. The prism 76a is sandwiched between the illumination portion 72a and the imaging portion 74a of the inspection portion 62A and the main surface 80 of the electronic component W disposed on the stop position SP22. The prism 76b is sandwiched between the illumination portion 72b and the imaging portion 74b and the main surface 80 of the electronic component W. In the example shown in FIG. 11, in the top view, the illumination portion 72a, the imaging portion 74s, and the prism 76a are disposed inside the electronic component W rather than the side surface 82 as an outer surface, and the illumination portion 72b, the imaging portion 74b, and the prism 76b are disposed inside the electronic component W rather than the side surface 86 as an outer surface. In this configuration, the imaging control portion 112 acquires two inspection images obtained by capturing images of the internal corner portions 82b, 86b.

Similarly to the illumination portions 72a, 72b of the inspection portion 62A, the illumination portion 72a (second illumination portion) of the inspection portion 64A irradiates the inner surface 90a and the inner surface 84a with the irradiation light via the prism 76a, and the illumination portion 72b (second illumination portion) of the inspection portion 64A irradiates the inner surface 90a and the inner surface 88a with the irradiation light via the prism 76b. Similarly to the imaging portions 74a, 74b of the inspection portion 62A, the imaging portion 74a (second imaging portion) of the inspection portion 64A forms an image of the irradiation light reflected on the inner surface 90a and the inner surface 84a via the prism 76a, and the imaging portion 74b (second imaging portion) of the inspection portion (4A forms an image of the irradiation light reflected on the inner surface 90a and the inner surface 88a via the prism 76b.

The illumination portion 72a of the inspection portion 64A and the imaging portion 74a face the main surface 80 of the electronic component W disposed on the stop position SP24 via the prism 76a (the prism 76a is sandwiched the illumination portion 72a of the inspection portion 64A and the imaging portion 74a between the main surface 80). The illumination portion 72b and the imaging portion 74b of the inspection portion 64A face the main surface 80 of the electronic component W disposed on the stop position SP24 via the prism 76b (the prism 76b is sandwiched between the illumination portion 72b and the imaging portion 74b of the inspection portion 64A and the main surface 80). In this configuration, the imaging control portion 114 acquires two inspection images obtained by imaging the internal corner portions 84b, 88b.

In the processing apparatus 1A according to the first modification, since the inspection of the inside of the two side surfaces is performed on one stop position SP2, the processing can be made more efficient as compared with the processing apparatus 1. For example, another processing portion that performs an inspection other than the internal defect inspection can be disposed on the stop position SP2 of the conveyance track CR2. Alternatively, the number of stop positions SP2 (holding portions 44) provided in the conveyance track CR2 can be reduced. In the inspection portions 62A, 64A, prisms 76a, 76b are used to emit the irradiation light to the inner surfaces of the two side surfaces which are positioned reversely each other along the optical path obliquely downward from the inside of the electronic component W respectively. Therefore, the flexibility of the layout of the illumination portion and the imaging portion is improved. The inspection portion 62A may be configured to be capable of capturing images of the internal corner portions 82b, 84b on the back side of the side surfaces 82, 84, and the inspection portion 64A may be configured to be capable of capturing images of the internal corner portions 86b, 88b on the back side of the side surfaces 86, 88. Each of the inspection portions 62, 64, 66, and 68 may include the illumination portion 72a, the imaging portion 74a, and the prism 76a instead of the illumination portion 72 and the imaging portion 74.

[Second Modification]

Figure 12:
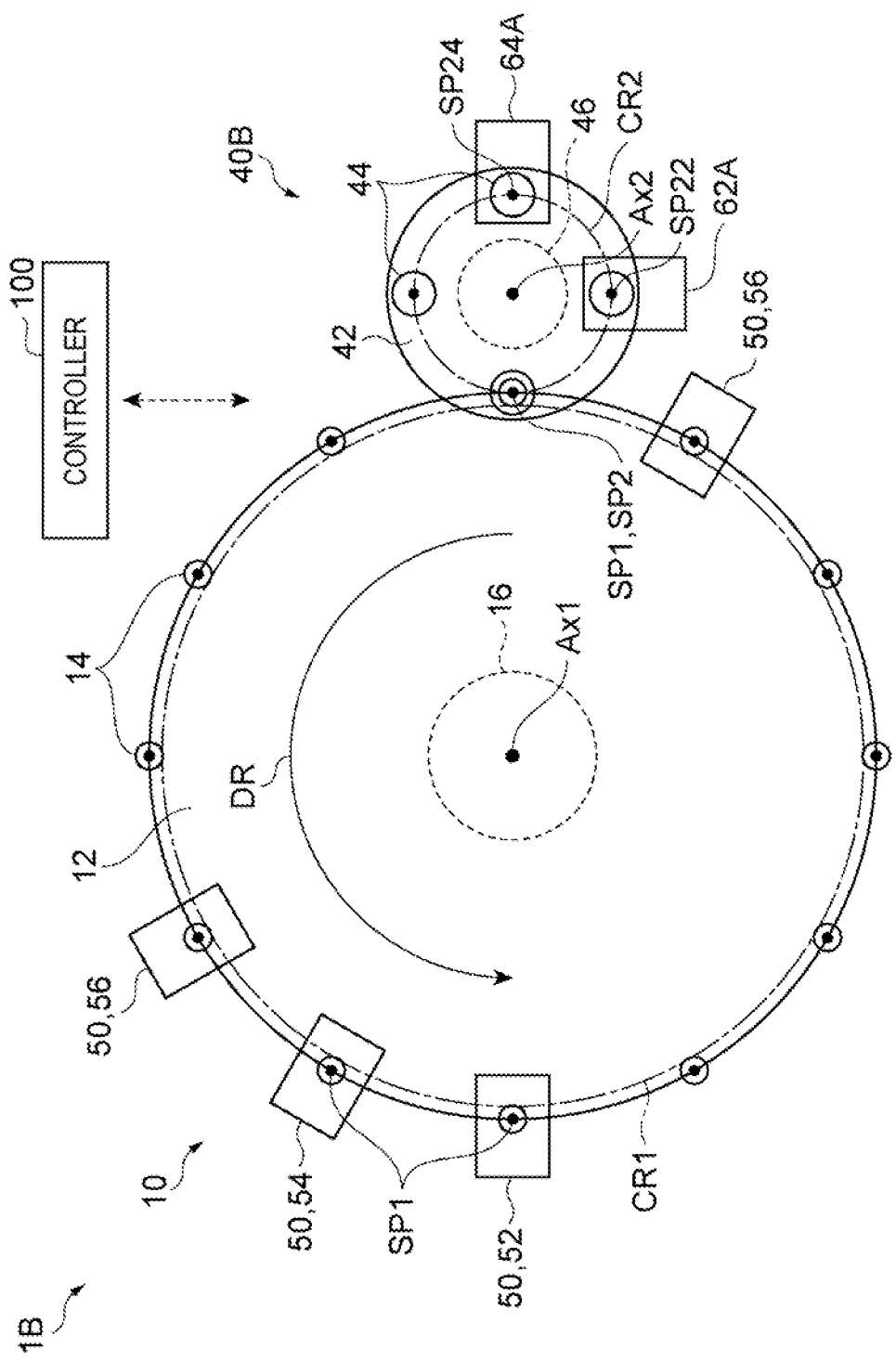
FIG. 12 is a plan view schematically illustrating an example of a processing apparatus for an electronic component.

The delivery of the two electronic components W may be performed on one stop position SP1 (one stop position SP2). FIG. 12 shows a processing apparatus 1B of an electronic component W according to a second modification. The processing apparatus 1B is different from the processing apparatus 1A in that a rotation conveyance portion 40B is provided instead of the rotation conveyance portion 40. The rotation conveyance portion 40B is different from the rotation conveyance portion 40 in that the conveyance track CR2 intersects with the conveyance track CR1 at one place. The conveyance track CR2 of the rotation conveyance portion 40B is positioned outside the conveyance track CR1. In the processing apparatus 1B, since the conveyance tracks CR1, CR2 intersect each other at one place, the delivery of the electronic component W is performed on the delivery stop positions SP1 and SP2 at one place.

In the rotation conveyance portion 40B, the inspection portions 62A, 64A may be respectively disposed on two stop positions SP2 other than the delivery stop positions SP1, SP2. A larger number of stop positions SP2 than shown in the figure are set on the conveyance track CR2 (the holding portion 44 is disposed), and the inspection portions 62, 64, 66, and 68 may be disposed on four stop positions SP2 other than the delivery stop position SP1 and SP2. The processing portion 70 which performs processing other than the inspection inside the side surface may be disposed on the stop position SP2 in the rotation conveyance portion 40B.

[Other Modifications]

The inspection of the inside of the four side surfaces may be performed on one stop position SP2 at the rotation conveyance portions 40, 40B. For example, one inspection portion may be configured to be capable of capturing images of the internal corner portions 82b, 84b, 86b, and 88b on the back sides of the side surfaces 82, 84, 86, and 88. The processing apparatuses 1, 1A, and 1B may perform the internal inspection of the electronic component W on a position different from that of the rotation conveyance portions 40, 40B. For example, the processing apparatuses 1, 1A, and 1B may include an inspection portion that inspects the inside of one side surface in one holding portion 44 disposed on a fixed position (first inspection position) below a stop position SP1, and may include an inspection portion that inspects the inside of another side surface in one holding portion 44 disposed on a fixed position (second inspection position) below a stop position SP1 next to the stop position SP1. In this case, the electronic component W may be conveyed between the positions where the inspection is performed by the rotation conveyance portion 10 (conveyance portion). The processing apparatuses 1, 1A, and 1B may sequentially inspect the internal corner portions on the back side of the four side surfaces by one imaging portion by rotating the holding portion 44 disposed on a fixed position below one stop position SP about a vertical axis passing through the holding portion 44.

The present technology may be applied to a processing apparatus for an electronic component including a horizontal conveyance portion (linear actuator) that moves the electronic component W along a straight line between one inspection position (first inspection position) and another inspection position (second inspection position). The processing apparatus for an electronic component needs to include at least the illumination portion 72 configured to emit the irradiation light which passes through at least a pan of the electronic component W disposed on a predetermined inspection position to the inner surface 82a and the inner surface 90a and the imaging portion 74 configured to capture an image of the internal corner portion 82b based on the irradiation light emitted from the main surface 80 after being reflected on the inner surface 82a and the inner surface 90a, so that the rotation conveyance portion or the like that conveys the electronic component W can be omitted. The bumps B may not be provided on the electronic component W to be processed. The wiring layer 94 may not be provided on the electronic component W to be processed. In this case, the imaging portion 74 may form an image of the irradiation light emitted from the main surface 80 after being reflected on the inner surface 82a and the back side (surface facing inside) of one boundary surface when the front side (surface facing the outside) of the one boundary surface between the inside and the outside of the electronic component W.

REFERENCE SIGNS LIST 1, 1A, 1B Processing apparatus
10 Rotation conveyance portion
40, 40B Rotation conveyance portion
60 Processing portion
62, 64, 66, 68, 62A, 64A Inspection portion
72, 72a, 72b Illumination portion
74, 74a, 74b Imaging portion
80, 90 Main surface
82, 84, 86, 88 Side surface
82a, 84a, 86a, 88a, 90a Inner surface
82b, 84b, 86b, 88b Internal corner portion
82c Inspection target region
100 Controller
102, 104 Conveyance control portion
112, 114, 116, 118 Imaging control portion
W Electronic component.

What is claimed is:

1. A processing apparatus for an electronic component, the processing apparatus comprising:

a first illumination portion configured to irradiate a second inner surface and a third inner surface of the electronic component with a first irradiation light via a first outer surface of the electronic component in a state where the electronic component is disposed on a first inspection position, the first irradiation light being capable of passing through at least a part of the electronic component, and the electric component including the first outer surface, a second outer surface on an reverse side of the first outer surface, a third outer surface connected to the first outer surface and the second outer surface, the second inner surface on an opposite side of the second outer surface, the third inner surface on an opposite side of the third outer surface, and a first internal corner portion formed by the second inner surface and the third inner surface;

a first imaging portion configured to capture an image of the first internal corner portion based on the first irradiation light emitted from the first outer surface after being reflected on the second inner surface and the third inner surface, a holding portion configured to hold the electronic component, wherein a transmittance of the first irradiation light to an inside of the electronic component in a case where the first outer surface is irradiated with the first irradiation light is higher than a transmittance of the first irradiation light to the inside of the electronic component in a case where the second outer surface is irradiated with the first irradiation light, and wherein the holding portion is configured to hold the electronic component on the first inspection position such that the first outer surface faces the first illumination portion and the first imaging portion;

a conveyance portion configured to convey the electronic component by moving the holding portion between the first inspection position and a second inspection position which is different from the first inspection position;

a second illumination portion configured to irradiate the second inner surface and a fourth inner surface with a second irradiation light via the first outer surface in a state where the electronic component is disposed on a second inspection position, the second irradiation light being capable of passing through at least a part of the electronic component, the electronic component further including a fourth outer surface connected to the first outer surface and the second outer surface, and the fourth inner surface being on an opposite side of the fourth outer surface;

a second imaging portion configured to capture an image of a second internal corner portion formed by the second inner surface and the fourth inner surface, based on the second irradiation light emitted from the first outer surface after being reflected on the second inner surface and the fourth inner surface; and a light shielding member which covers the first inspection position, the second inspection position, an optical path of the first irradiation light from the first illumination portion to the first imaging portion, and an optical path of the second irradiation light from the second illumination portion to the second imaging portion.

2. The processing apparatus according to claim 1, wherein the first internal corner portion includes an inspection target region extending along an intersection line between the second inner surface and the third inner surface, and wherein the first imaging portion has a field of view capable of capturing an image of an entire region of the inspection target region in a state of being positioned on a fixed position.

3. A processing apparatus for an electronic component, the processing apparatus comprising:

a first illumination portion configured to irradiate a second inner surface and a third inner surface of the electronic component with a first irradiation light via a first outer surface of the electronic component in a state where the electronic component is disposed on a first inspection position, the first irradiation light being capable of passing through at least a part of the electronic component, and the electric component including the first outer surface, a second outer surface on an reverse side of the first outer surface, a third outer surface connected to the first outer surface and the second outer surface, the second inner surface on an opposite side of the second outer surface, the third inner surface on an opposite side of the third outer surface, and a first internal corner portion formed by the second inner surface and the third inner surface;

a first imaging portion configured to capture an image of the first internal corner portion based on the first irradiation light emitted from the first outer surface after being reflected on the second inner surface and the third inner surface, a holding portion configured to hold the electronic component, wherein a transmittance of the first irradiation light to an inside of the electronic component in a case where the first outer surface is irradiated with the first irradiation light is higher than a transmittance of the first irradiation light to the inside of the electronic component in a case where the second outer surface is irradiated with the first irradiation light, and wherein the holding portion is configured to hold the electronic component on the first inspection position such that the first outer surface faces the first illumination portion and the first imaging portion, a conveyance portion configured to convey the electronic component by moving the holding portion between the first inspection position and a second inspection position which is different from the first inspection position;

a second illumination portion configured to irradiate the second inner surface and a fourth inner surface with a second irradiation light via the first outer surface in a state where the electronic component is disposed on a second inspection position, the second irradiation light being capable of passing through at least a part of the electronic component, the electronic component further including a fourth outer surface connected to the first outer surface and the second outer surface, and the fourth inner surface being on an opposite side of the fourth outer surface;

a second imaging portion configured to capture an image of a second internal corner portion formed by the second inner surface and the fourth inner surface, based on the second irradiation light emitted from the first outer surface after being reflected on the second inner surface and the fourth inner surface; and a conveyance control portion configured to convey the electronic component between the first inspection position and the second inspection position by the conveyance portion;

a first imaging control portion configured to cause the first illumination portion to irradiate the second inner surface and the third inner surface with the first irradiation light, and causes the first imaging portion to capture an image of the first internal corner portion, in a state where the conveyance control portion causes the holding portion to stop on the first inspection position; and a second imaging control portion configured to cause the second illumination portion to irradiate the second inner surface and the fourth inner surface with the second irradiation light, and causes the second imaging portion to capture an image of the second internal corner portion, in a state where the conveyance control portion causes the holding portion to stop on the second inspection position.

4. The processing apparatus according to claim 1, wherein the first illumination portion and the first imaging portion are disposed on an extension line of the first irradiation light, and wherein the first illumination portion is configured to not block the first irradiation light towards the first imaging portion.

* * * * *